United States Patent
Chou et al.

(10) Patent No.: US 7,758,794 B2
(45) Date of Patent: Jul. 20, 2010

(54) METHOD OF MAKING AN ARTICLE COMPRISING NANOSCALE PATTERNS WITH REDUCED EDGE ROUGHNESS

(75) Inventors: Stephen Y. Chou, Princeton, NJ (US); Zhaoning Yu, Levittown, PA (US); Wei Wu, Mountain View, CA (US)

(73) Assignee: Princeton University, Princeton, NJ (US)

( * ) Notice: Subject to any disclaimer, the term of this patent is extended or adjusted under 35 U.S.C. 154(b) by 1426 days.

(21) Appl. No.: 10/732,038

(22) Filed: Dec. 10, 2003

(65) Prior Publication Data

US 2004/0156108 A1 Aug. 12, 2004

Related U.S. Application Data

(63) Continuation-in-part of application No. 10/046,594, filed on Oct. 29, 2001.

(60) Provisional application No. 60/432,213, filed on Dec. 10, 2002, provisional application No. 60/432,216, filed on Dec. 10, 2002.

(51) Int. Cl.
  *B29C 59/02* (2006.01)
  *B29D 11/00* (2006.01)
(52) U.S. Cl. .......................... 264/319; 216/24; 216/41; 264/1.31; 264/2.5; 264/2.7; 264/219
(58) Field of Classification Search .................. 264/1.1, 264/1.24, 2.6, 2.7, 319, 320, 1.31, 2.5, 219; 216/41, 24; 425/808
See application file for complete search history.

(56) References Cited

U.S. PATENT DOCUMENTS

| | | | |
|---|---|---|---|
| 2,302,024 A | 11/1942 | Goss, Jr. | |
| 3,742,229 A | 6/1973 | Smith et al. | |
| 3,743,842 A | 7/1973 | Smith et al. | |
| 3,833,303 A | 9/1974 | Burns et al. | |
| 3,923,566 A | 12/1975 | Law | |
| 3,951,548 A | 4/1976 | Westell | |
| 4,037,325 A | 7/1977 | Weber et al. | |
| 4,200,395 A | 4/1980 | Smith et al. | |

(Continued)

FOREIGN PATENT DOCUMENTS

EP 244884 3/1986

(Continued)

OTHER PUBLICATIONS

Broers, et al., "250-A Linewidths with PMMA Electron Resist", *Applied Physics Letter* 33 (5), 1978 American Institute of Physics, 392-394, (Sep. 1, 1978).

(Continued)

*Primary Examiner*—Mathieu D. Vargot
(74) *Attorney, Agent, or Firm*—Polster, Lieder, Woodruff & Lucchesi, LC

(57) ABSTRACT

In accordance with the invention, an article comprising a nanoscale surface pattern, such as a grating, is provided with a nanoscale patterns of reduced edge and/or sidewall roughness. Smooth featured articles, can be fabricated by nanoimprint lithography using a mold having sloped profile molding features. Another approach uses a mold especially fabricated to provide smooth sidewalls of reduced roughness, and a third approach adds a post-imprint smoothing step. These approaches can be utilized individually or in various combinations to make the novel articles.

5 Claims, 21 Drawing Sheets

U.S. PATENT DOCUMENTS

| | | |
|---|---|---|
| 4,211,489 A | 7/1980 | Kleinknecht et al. |
| 4,287,235 A | 9/1981 | Flanders |
| 4,294,650 A | 10/1981 | Werthmann |
| 4,310,743 A | 1/1982 | Seliger |
| 4,325,779 A | 4/1982 | Rossetti |
| 4,383,026 A | 5/1983 | Hall |
| 4,450,358 A | 5/1984 | Reynolds |
| 4,475,223 A | 10/1984 | Taniguchi et al. |
| 4,498,009 A | 2/1985 | Reynolds |
| 4,512,848 A | 4/1985 | Deckman et al. |
| 4,516,253 A | 5/1985 | Novak |
| 4,543,225 A | 9/1985 | Beaujean |
| 4,552,615 A | 11/1985 | Amendola et al. |
| 4,576,678 A | 3/1986 | Shibata |
| 4,588,468 A | 5/1986 | McGinty et al. |
| 4,592,081 A | 5/1986 | Eaton et al. |
| 4,606,788 A | 8/1986 | Moran |
| 4,664,862 A | 5/1987 | Ghavamikia |
| 4,731,155 A | 3/1988 | Napoli et al. |
| 4,738,010 A | 4/1988 | Ehrfeld et al. |
| 4,781,790 A | 11/1988 | Wu |
| 4,788,015 A | 11/1988 | Sakai et al. |
| 4,832,790 A | 5/1989 | Rossetti |
| 4,883,563 A | 11/1989 | Kotani et al. |
| 5,032,216 A | 7/1991 | Felten |
| 5,119,151 A | 6/1992 | Onda |
| 5,152,861 A | 10/1992 | Hann |
| 5,234,571 A | 8/1993 | Noeker |
| 5,253,409 A | 10/1993 | Bier et al. |
| 5,259,926 A | 11/1993 | Kuwabara et al. |
| 5,277,749 A | 1/1994 | Griffith et al. |
| 5,338,396 A | 8/1994 | Abdala et al. |
| 5,352,394 A | 10/1994 | Fujita et al. |
| 5,425,848 A | 6/1995 | Haisma et al. |
| 5,434,107 A | 7/1995 | Paranjpe |
| 5,471,455 A | 11/1995 | Jabr |
| 5,503,963 A | 4/1996 | Bifano |
| 5,638,355 A | 6/1997 | Jabr |
| 5,861,113 A | 1/1999 | Choquette et al. |
| 6,056,526 A | 5/2000 | Sato |
| 2003/0020189 A1* | 1/2003 | Chen et al. ............... 264/1.24 |

FOREIGN PATENT DOCUMENTS

| | | |
|---|---|---|
| JP | 1196749 | 1/1988 |
| JP | 4332694 | 8/1991 |
| JP | 4255307 | 9/1992 |
| JP | 5-251740 | * 9/1993 |
| WO | 9117565 | 11/1991 |
| WO | WO 93/21671 | 10/1993 |
| WO | 98/26913 | 6/1998 |

OTHER PUBLICATIONS

Chou, S.Y., et al., "Imprint Lithography with 25-Nanometer Resolution", *Science*, vol. 272, 85-87, (Apr. 5, 1996).

Early, K., et al., "Absence of Resolution Degradation in X-Ray Lithography for Wavelength from 4.5nm to 0.83nm", *Microelectronic Engineering 11*, Elsevier Science Publishers B.V., 317-321, (1990).

Fischer, et al., "10 nm Electron Beam Lithography and sub-50 nm Overlay Using a Modified Scanning Electron Microscope", *Applied Physics Letter* 62 (23), 1993 American Institute of Physics, 2989-2991 (Jun. 7, 1993).

Hara, et al., "An Alignment Technique Using Diffracted Moire Signals", *J. Vac. Sci. Technol.* B7 (6), 1989 American Vacuum Society, 1977-1979, (Nov./Dec. 1989).

Harmening, et al., "Molding of Threedimensional Microstructures by the Liga Process" Proceedings IEEE: *Micro Electro* Mechanical Systems, Travemunde, Germany, 202-207, (1992).

Li, et al., "Molding of Plastic Components Using Micro-EDM Tools", *IEEE/CHMT International Electronics Manufacturing Technology Symposium* 145-149, (1992).

Nomura, et al., Moire Alignment Technique for the Mix and Match Lithographic System: *J. Vacuum Society Technol. B6* (1), American Vacuum Society, 394-398, (Jan./Feb. 1988).

Kamins, T.I., et al., "Positioning of Self-Assembled, single-crystal,germanium islands by silicon nanoimprinting" Applied Physics Letter, vol. 74, No. 12, Mar. 22, 1999.

Wang, J., et al., "Fabrication of a new broadband waveguide polarizer with a double-layer 190 nm period metal-gratings using nanoimprint lithography" J. Vac. Sc. Technol. B 17 (6) Nov./Dec. 1999.

Tan, H., et al., "Roller Nanoimprint Lithography" Vac. Sci. Technol. B 16 (6) Nov./Dec. 1998.

Feynman, Richard, "There's Plenty of Room at the Bottom-An Invitation to Enter a New Field of Physics" talk delivered at the annual meeting of the American Physical Society at the California Institute of Technology (Caltech) in 1959, published in Feb. 1960 issue of Caltech's "Engineering and Science".

Flanders, D.C., "X-ray Lithography at ~ 100 A linewidths using x-ray masks fabricated by shadowing techniques" Journal of Vacuum Science and Technology, 16 (6), Nov./Dec. 1979 (received Jun. 11, 1979), pp. 1615 to 1619, published American Vacuum Society, USA.

Jorritsma et al., "Fabrication of large arrays of metallic nanowires on V-grooved substrates" Applied Physics Letters 67 (10), Sep. 4, 1995 (received May 16, 1995), pp. 1489-1491, published by American Institute of Physics, USA.

Aumiller et al., "Submicrometer Resolution Replication of Relief Patterns for Integrated Optics", J. Appl. Phys., vol. 45, pp. 4557-4562, (1974).

Nisper, "Injection-molded replication of binary optic structures", SPIE v2600 Oct. 23-24, 1995 p. 56-64 0227-786X.

Shvartsman, "Holographic optical elements by dry photopolymer embossing" SPIE (1991) 1461 (pract. Holog. S) pp. 313-320.

"Fabrication of submicron crossed square wave gratings by dry etching and thermoplastic replication techniques" JVST B vol. 1, No. 4, Dec. 1983 pp. 1207-1210.

Healey et al., "Photodeposition of Micrometer-scale polymer patterns on optical imaging Fibers" Science vol. 269, Aug. 1995, pp. 1078-1080.

* cited by examiner

METHOD OF MAKING AN ARTICLE COMPRISING NANOSCALE PATTERNS WITH REDUCED EDGE ROUGHNESS

CROSS REFERENCE TO RELATED APPLICATIONS

This application is a continuation-in-part of U.S. patent application Ser. No. 10/046,594 filed by Stephen Chou on Oct. 29, 2001, which claims priority to U.S. patent application Ser. No. 09/107,006 filed by Stephen Chou on Jun. 30, 1998 (now U.S. Pat. No. 6,309,580 issued Oct. 30, 2001) and which, in turn, claims priority to U.S. patent application Ser. No. 08/558,809 filed by Stephen Chou on Nov. 15, 1995 (now U.S. Pat. No. 5,772,905 issued Jun. 30, 1998). The foregoing '594 application, '006 and '809 application are each incorporated herein by reference.

This application also claims the benefit of U.S. Provisional Application Serial No. 60/432,213 filed by Stephen Chou, Zhaoning Yu and Wei Wu on Dec. 10, 2002 entitled "Making Nano-Patterns With Reduced Edge Roughness" and also claims the benefit of U.S. Provisional Application Serial No. 60/432,216 filed by Stephen Chou and Zhaoning Yu on Dec. 10, 2002 entitled "Making Nano-Patterns Using Masks With Non-Vertical Sidewalls." The above '213 and '216 provisional applications are incorporated herein by reference.

GOVERNMENT INTEREST

This invention was made with government support under the following grants: N66001-01-1-8963 awarded by Space and Naval Warfare Systems; DAAG-55-98-1-0270 awarded by the Army Research Office; and N00014-01-1-0741 awarded by the Office of Naval Research. The government has certain rights in this invention.

FIELD OF THE INVENTION

This invention relates to nanoscale patterned articles having patterned surface features of minimum lateral dimension under a micrometer and preferably under 100 nanometers or less. It is directed to such articles having patterned edges and walls of reduced roughness compared to those conventionally available and to methods of making such patterned articles.

BACKGROUND OF THE INVENTION

Nanoscale patterned articles, such as nanoscale gratings and wires, have many important applications in optics, electronics, biotechnology, and micro-fluidics. They can be used to filter and direct light, to facilitate fabrication of nanoscale mechanical and electronic devices, and to analyze biological molecules.

A typical nanoscale patterned article comprises a substrate with a microscopically patterned surface. A nanoscale grating, for example, can comprise a substrate, such as silicon or resist coated silicon, having a surface array of protruding parallel lines separated by intervening recessed lines. The lines can have a minimum dimension of under 100 nanometers and the spacing between successive lines can be on the order of 200 nm or less. Other articles use different surface patterns of comparably small feature size.

The roughness of line edges and sidewalls in such nanoscale surface patterns has an important bearing on device performance. Studies have shown that roughness causes scattering loss in optical devices, impedes electron transport through nano-scale wires and degrades performance in bio-analytic and micro-fluidic systems.

A variety of approaches have been proposed for the fabrication of smooth nanoscale surface patterned devices, but most are unsuitable for large-scale production. Previous fabrication methods include electron-beam lithography and interference lithography. Electron beam lithography, however, is a serial processing technique of inherently low throughput. Interference lithography is affected by random factors such as disturbances and instabilities in the exposure system which contribute to roughness.

Other approaches to reducing roughness include anisotropic wet etching and thermal oxidation of pattern sidewalls with etch-back. Anisotropic wet etching, however, can only be used on a limited class of crystalline materials. And thermal oxidation requires high temperature processing incompatible with many desirable materials.

Nanoimprint lithography (NIL) is a promising approach to patterning smooth nanoscale features. In NIL, a nanofeatured molding surface is typically imprinted into a surface, such as a polymer-coated substrate. The imprinted pattern can then be coated, as with metal, or the imprinted material can be selectively removed to expose the substrate surface for further processing. Further details concerning nanoimprint lithography are set forth in applicant's U.S. Pat. No. 5,772,905 issued Jun. 30, 1998 and entitled "Nanoimprint Lithography" and U.S. Pat. No. 6,482,742 issued Nov. 19, 2002 and entitled "Fluid Pressure Imprint Lithography." The '905 and '742 patents are incorporated herein by reference.

The present invention provides articles comprising nanoscale patterns with reduced edge and sidewall roughness through adaptations in NIL processing.

SUMMARY OF THE INVENTION

In accordance with the invention, an article comprising a nanoscale surface pattern, such as a grating, is provided with a nanoscale patterns of reduced edge and/or sidewall roughness. Smooth featured articles, can be fabricated by nanoimprint lithography using a mold having tapered profile molding features. Another approach especially fabricates the mold to provide smooth sidewalls of reduced roughness, and yet a third approach provides the article with a post-imprint smoothing step. These approaches can be utilized individually or in combination to make the novel smooth featured articles.

BRIEF DESCRIPTION OF THE DRAWINGS

The advantages, nature and various additional features of the invention will appear more fully upon consideration of the illustrative embodiments shown in the accompanying drawings. In the drawings:

FIG. 3A shows the grating before the removal of the original mask. FIG. 3B shows the grating with the mask removed.

FIGS. 10A1 through 10C2 illustrate that a triangle mold for imprinting, can achieve better line-width uniformity despite variations in the original mask.

Figure 1A:
FIGS. 1A-1D are a cross-sectional view showing the steps in fabricating a triangle profile mold.
Figure 1B:
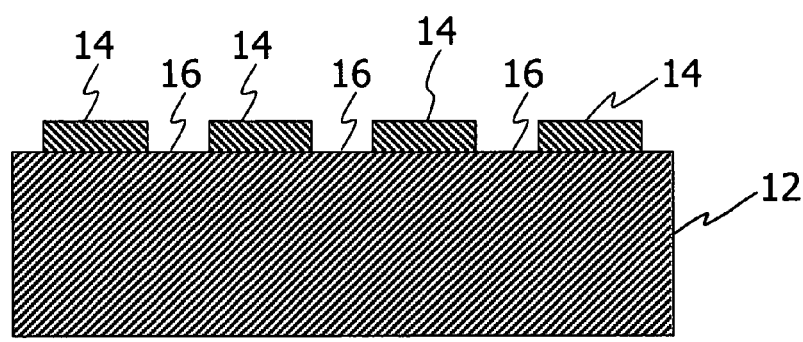

It is to be understood that these drawings are for the purpose of illustrating the concepts of the invention, and except for the photographs and graphs, are not to scale. Similar components are similarly designated throughout the drawing.

DETAILED DESCRIPTION

The description is divided into four parts. Part I describes an exemplary article having a nanoscale pattern with smooth edges and/or sidewalls, and Parts II, III and IV describe approaches for making such articles.

I. Exemplary Article

Figure 20:
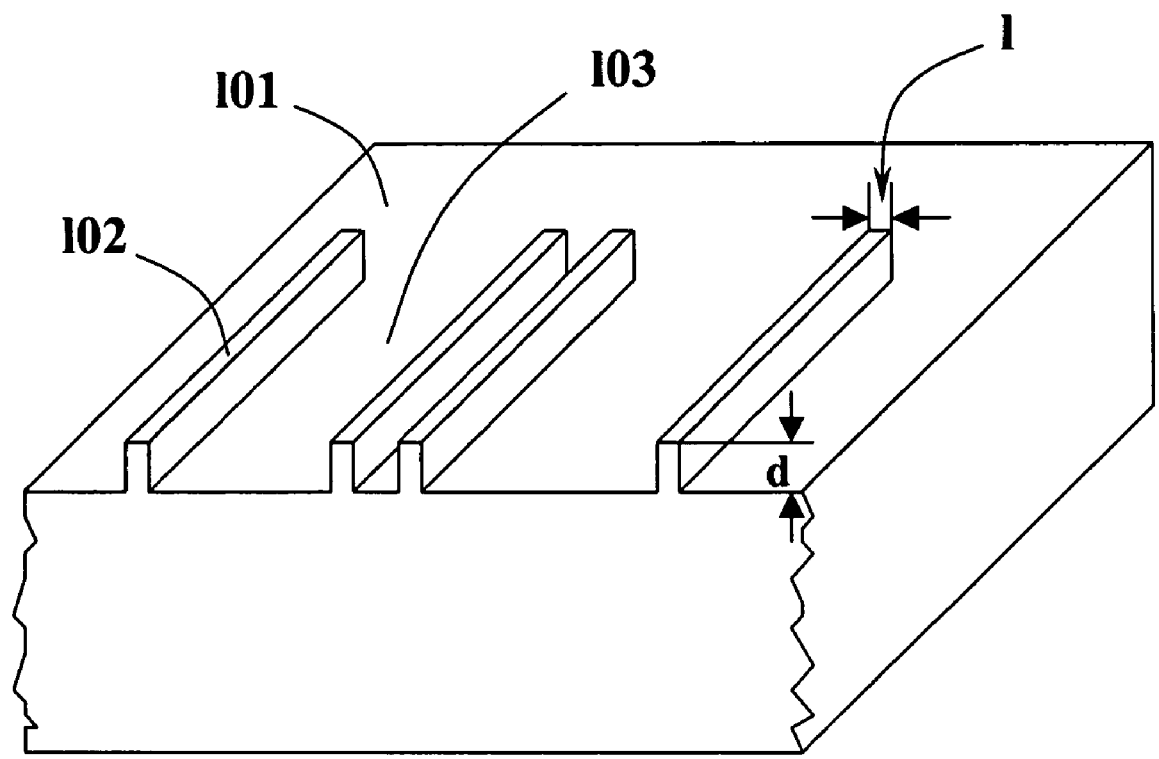
FIG. 20 is a schematic perspective view illustrating features of an article comprising a nanoscale patterned surface.

Referring to the drawings, FIG. 20 is a schematic top view of an exemplary article 100 comprising a nanoscale patterned surface 101. Typical useful nanoscale surface patterns 101 are comprised of a plurality of protruding features 102 and one or more recessed features 103 having at least one protruding feature with a minimum lateral dimension l of less than 100 nm. State of the art is less than 25 nm and as small as 10 nm or less. The depth d between a protruding feature and a recessed feature is typically less than 250 nm and can be as small as 5 nm. Molds for making the patterns have complementary patterns with correspondingly small dimensions. In accordance with the invention, the surface patterns are provided with smooth pattern edges 104 and/or smooth pattern sidewalls 105 having reduced roughness as compared with conventional nanoscale surface patterns. The article 100 differs from conventional nanoscale gratings in that the edges 102 have a low roughness of less than about 10 nanometers (i.e. no protrusions from the edge larger than 10 nanometers will appear on an SEM) and preferably less than about 5 nanometers and/or the sidewalls 103 have a low roughness of less than about 5 nanometers.

A particular embodiment of such an article can be a large area sub-200 nanometer period grating. In a typical grating, the protruding features form an array of parallel lines separated by intervening recessed regions. Such gratings are cornerstone structures for many applications. They can be used in UV optical filters, polarizers, sub-wavelength optical devices and ultrahigh density patterned magnetic media.

II. NIL Using Tapered Molds To Reduce Pattern Edge Roughness

Unlike previous imprint-based patterning techniques, the present approach uses grating molds with tapered and preferably triangle-shaped profiles. The complement of the triangle profile relief pattern on the mold is then transferred into a resist thin film carried on a substrate by pressing the mold into the resist and removing the mold.

In essence, this first approach to making a nanoscale surface patterned article with smooth pattern edges and sidewalls comprises the steps of 1) providing a mold with a molding surface having a plurality of tapered regions; 2) providing a workpiece with a moldable surface; 3) pressing the molding surface and the moldable surface together to reduce the thickness of the moldable surface under the protruding features. This step produces reduced thickness regions; and 4) separating the mold and the moldable layer. The workpiece can then be further processed in the patterned regions to complete a nanoscale surface patterned article.

In exemplary subsequent steps, metal (or other suitable material) can be coated selectively onto the tips of the resist triangles through oblique angle deposition (e.g. shadow evaporation). After removing the portions of the resist that are not covered by the evaporated material to expose the underlying substrate, the grating pattern in the resist can be replicated in a material that is added onto the substrate or can be replicated directly into the substrate.

This approach offers many advantages over the prior art. First, the mold can be patterned to achieve extremely smooth (on the atomic level) sidewalls. The smoothness can be preserved and replicated in the resist (and the underlying substrate) because of the high-resolution (<10 nm) of nanoimprint lithography. Thus the approach produces patterns with smoothness unattainable by the prior art.

Second, this approach offers an advantageous way for controlling the grating duty cycle simply by changing the angle of incidence for shadow evaporation. Different line-widths can be obtained even when using the same mold. Our experiments show the line-width is linearly dependent on the angle of incidence, and it provides a line-width tunable range from 25% to 75% of the grating period. This is believed unachievable with the prior art.

Thirdly, the approach utilizes the natural crystalline orientations of the material that makes up the mold body. The resulting triangle grating lines will have the same apex angle in spite of the possible variations of line-width in the original pattern. Thus, the approach standardizes the mold topology and, at the same time, improves line-width uniformity across a wafer and from wafer to wafer.

Figure 4:
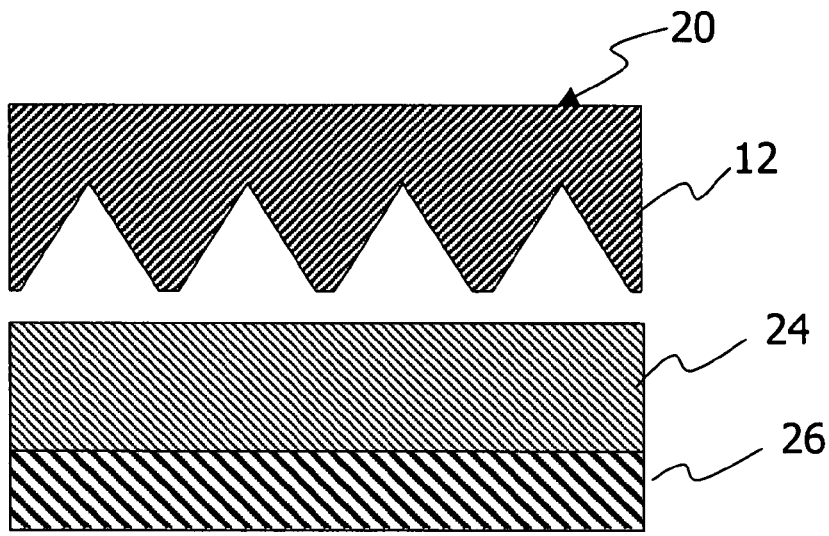
FIGS. 4A-4C show steps in creating a triangle-profile relief pattern in resist, by first pressing a triangle mold into the resist, and then removing the mold from the resist.
Figure 4:
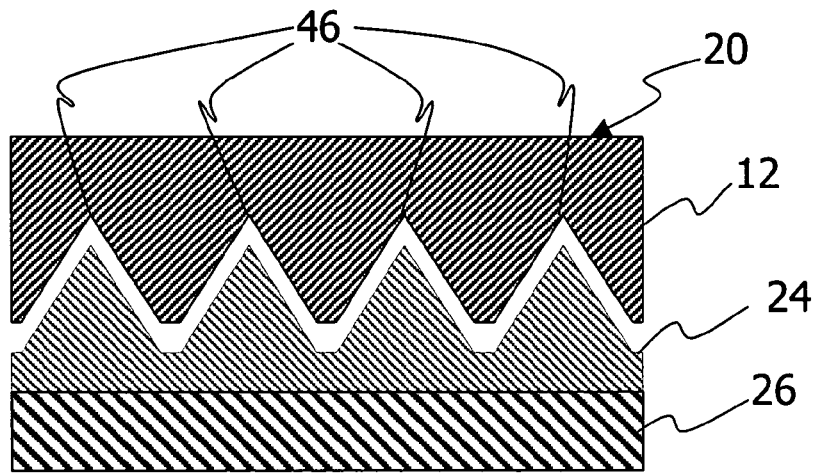
Figure 4:
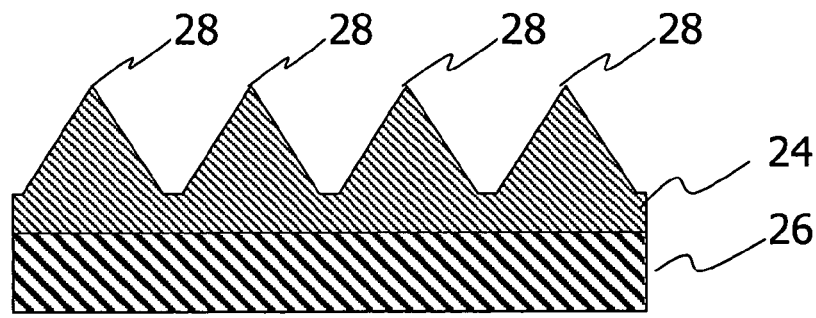

We now describe how to provide a mold with tapered projecting features in FIG. 1 and how to use the mold to make a nanoscale patterned article in FIG. 4 et seq.

FIG. 1A shows an exemplary mold body 12 which can comprise a crystalline material. Crystals of silicon are preferred but other crystalline materials can be used. The surface of the mold body (which will be patterned with the desired features) carries a mold mask layer 10. This surface of body 12 can be prepared in a way so that it is parallel to one of the (100) crystalline planes of the mold body material. The mask layer 10 can be grown or deposited through any appropriate technique such as thermal oxidation or chemical vapor deposition (CVD).

The mask layer 10 is then patterned into mask portions 14 (here a grating) to expose portions 16 of the mold surface (FIG. 1B) using suitable patterning techniques such as interference lithography, imprint lithography, electron beam lithography, or pattern transfer techniques such as lift off or reactive ion etching (RIE).

Figure 1C:
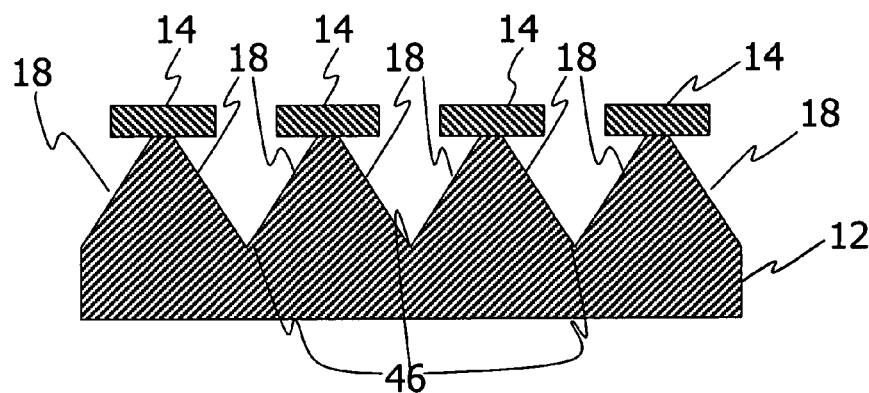
Figure 1D:
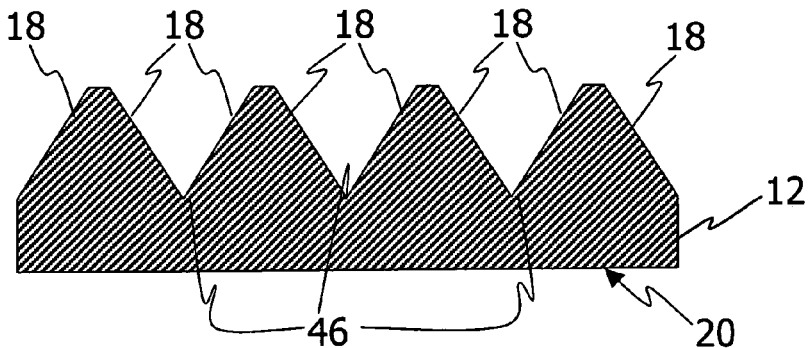

FIG. 1C shows the grating pattern etched into the mold surface using a suitable anisotropic etching process such as wet chemical etching. Generally this etching process should be highly selective in its etching rates between the directions normal to (100) and (111) crystal planes of the material comprising the mold body, with the etching rate normal to (100) plane higher than the rate normal to (111) plane. This anisotropy is chosen to produce a tapered triangle-shaped etching profile, exposing the highly smooth (111) crystal planes 18. FIG. 1D shows the cross-sectional view of the finished mold after the removal of the remaining mask material 14.

In one experiment, the mold body 12 was made in a (100) silicon substrate, with the mask material 10 being a layer of thermally grown silicon dioxide. The thickness of the oxide typically ranges from 30 nm to 300 nm. The mask layer 10 was then patterned into portions 14 of a 200 nm period grating using interference lithography and reactive ion etching.

The substrate was briefly dipped into a diluted hydrofluoric acid (HF) to remove oxide that may have remained in the regions 16 between the mask lines 14. A mixture of 500 g potassium hydroxide (KOH), 1600 ml deionized (DI) water, and 400 ml isopropyl alcohol (IPA) was used for the wet chemical etching step indicated in FIG. 1C. The etching selectivity between the direction normal to (100) plane and the direction normal to (111) plane is greater than 20.

Figure 2:
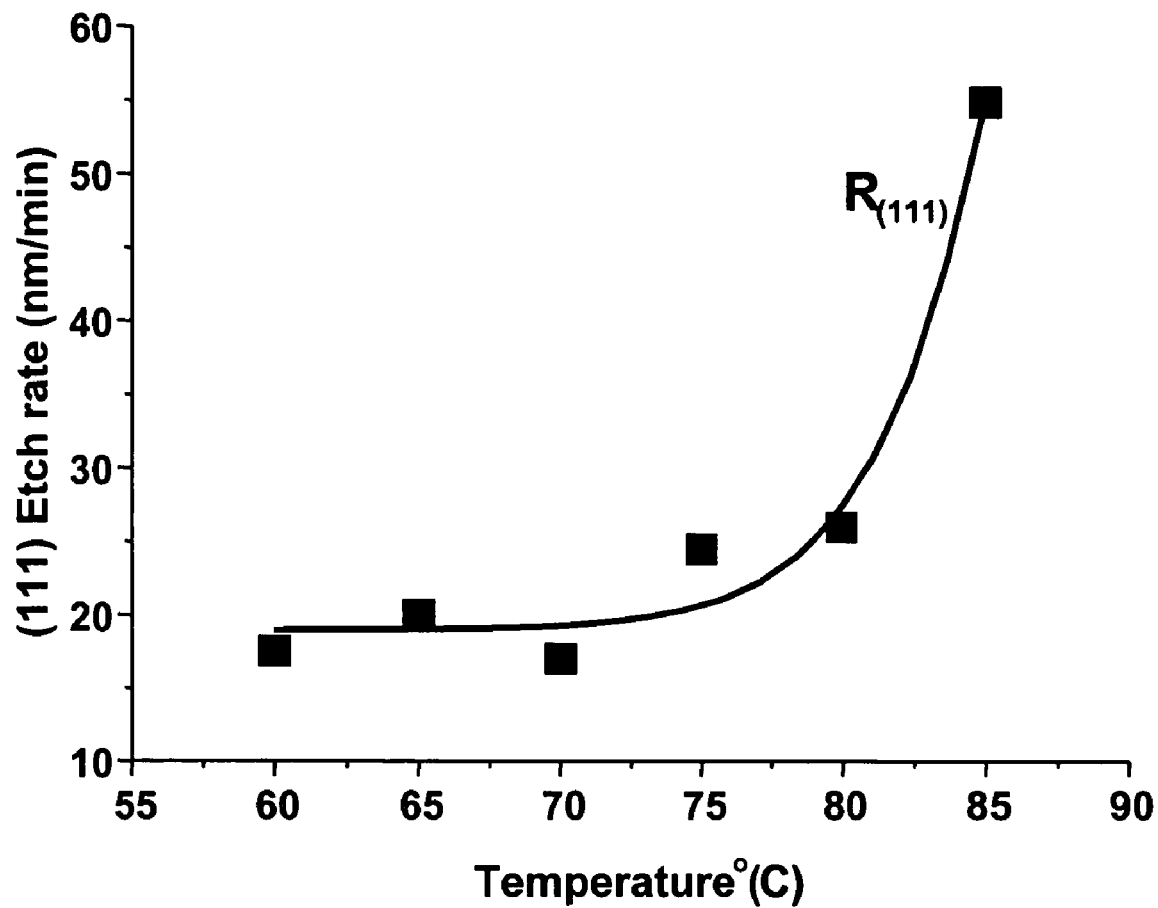
FIG. 2 graphically illustrates the silicon etching rate in (111) direction as a function of temperature in a KOH:H20: isopropyl alcohol mixture.

FIG. 2 shows the measured etching rate normal to (111) plane ($R_{111}$) as a function of the temperature for this wet etching recipe. Data in FIG. 2 indicates the etching rate is less sensitive to temperature variations at 65° C., which was chosen for the etching of the mold to achieve better uniformity across a 4-inch wafer. The optimum etching time depends on the grating period, line-width of the mask 14, and the material of the mold body 12. For this embodiment using (100) silicon substrates and a 200 nm grating period, the etching time usually lies between 30 and 90 seconds. A triangle profile mold was obtained after the remaining oxide mask 14 was finally removed using hydrofluoric acid.

It should be understood that methods for creating a triangle profiled grating mold are not limited to those described here. For example, instead of patterning a deposited film 10, material can be added onto the substrate to create the grating mask 14 through suitable means such as evaporation and lift-off.

Figure 3:
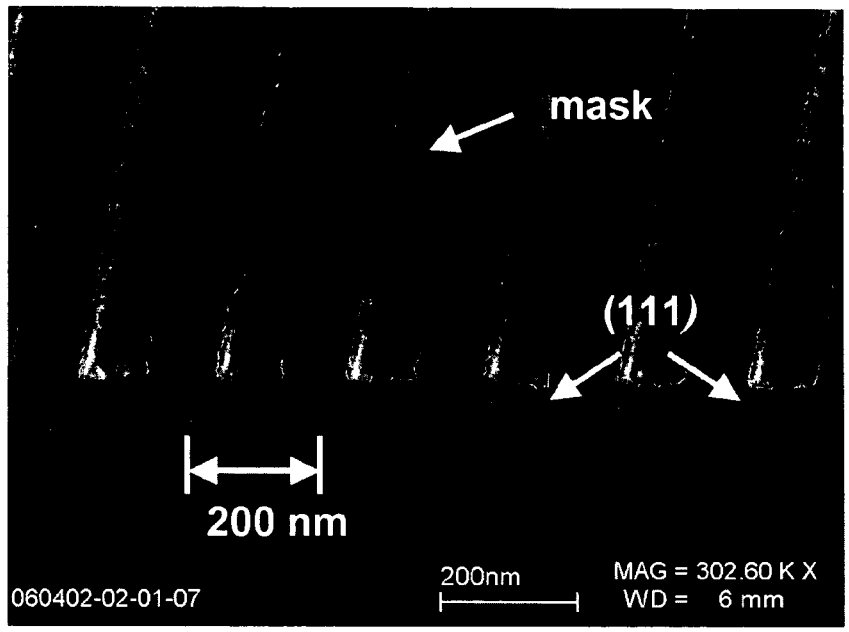
FIGS. 3A and 3B are a scanning electron micrograph of a triangle profile mold etched in a (100) silicon substrate with a 200 nm grating period.
Figure 3:
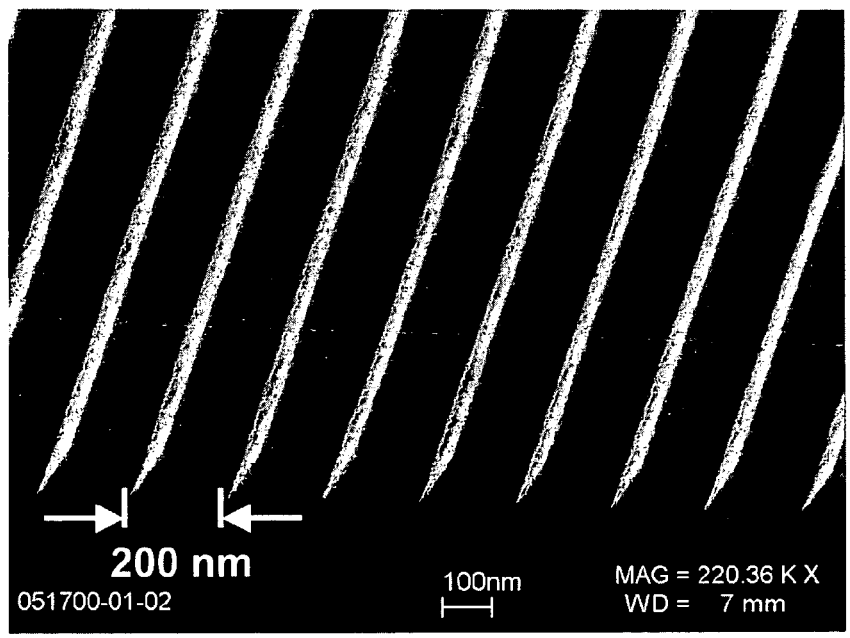

FIG. 3B is a scanning electron micrograph of a perspective view of a triangle-profile grating mold created in (100) silicon using the steps illustrated in FIG. 1. The surfaces of these features are extremely smooth due to the wet chemical etching. FIG. 3A is the grating with the original rough-edged mask lines, which clearly shows the effectiveness of wet-etching in reducing edge roughness.

FIGS. 4A-4C show steps using the triangle-profile grating mold 20 for patterning resist using nanoimprint lithography. A workpiece comprising an imprint resist thin film 24 supported on a substrate 26 is brought in contact with the mold 20. The mold is pressed into the resist 24, typically after heating to allow sufficient softening of the resist 24. Mold 20 is removed from the resist 24 after cooling to leave an imprinted relief pattern 28 in the resist 24, which compliments the shape of the features 46 in the mold, e.g. recessed regions 46 in the mold shape protruding features 28 in the resist.

Figure 5A:
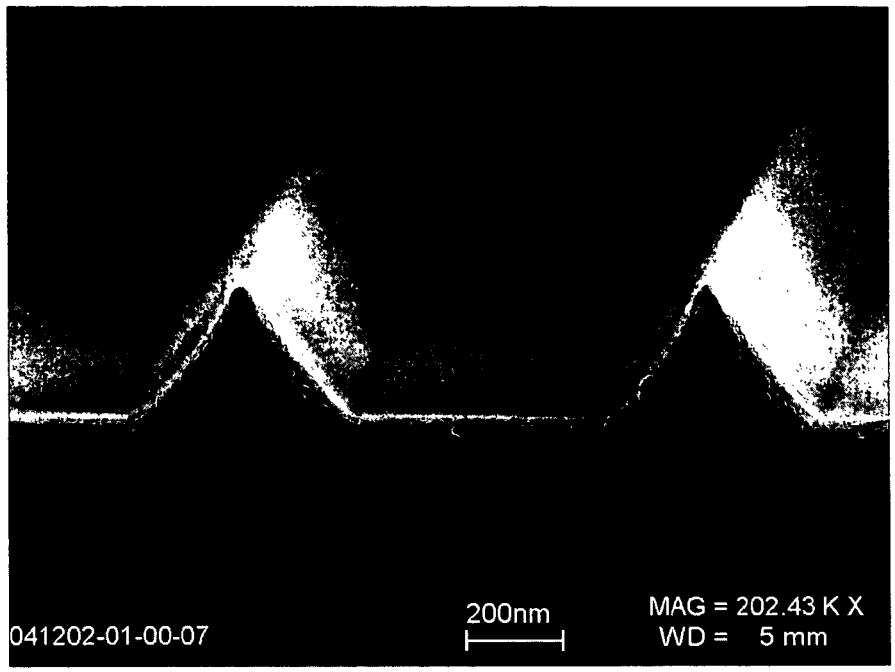
FIG. 5A and FIG. 5B are scanning electron micrographs (SEMs) of triangle profile resist gratings created by nanoimprinting with triangle profile molds, with periods of 1 μm and 200 nm, respectively.
Figure 5B:
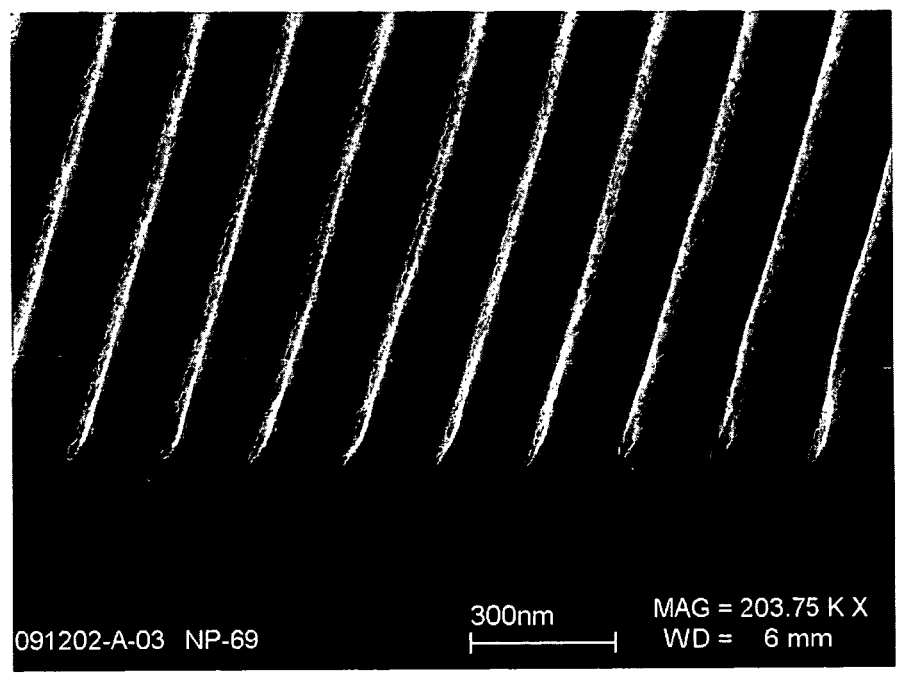

FIG. 5A and FIG. 5B are scanning electron micrographs of cross-sections of resist gratings patterned by nanoimprint lithography using triangle-profile molds in accordance with the steps described in FIG. 4. The resist patterns conform well to the shapes of the features on the molds because of the high-resolution (<10 nm) of nanoimprint lithography.

Figure 6A:
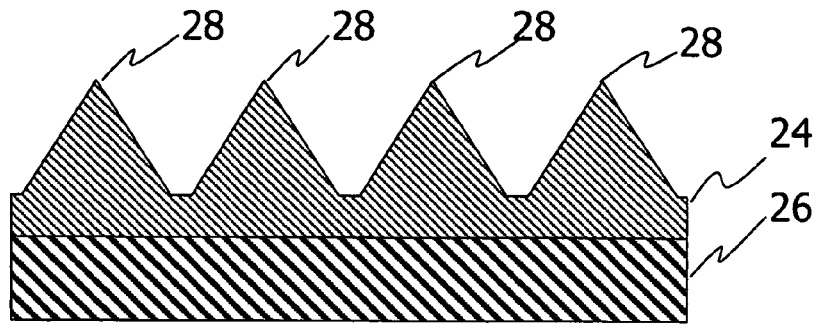
FIGS. 6A-6D show steps in the creation deposited masks on the distal tips of the resist triangles using shadow evaporation and then removing the uncovered portions of the resist to expose the underlying substrate.
Figure 6B:
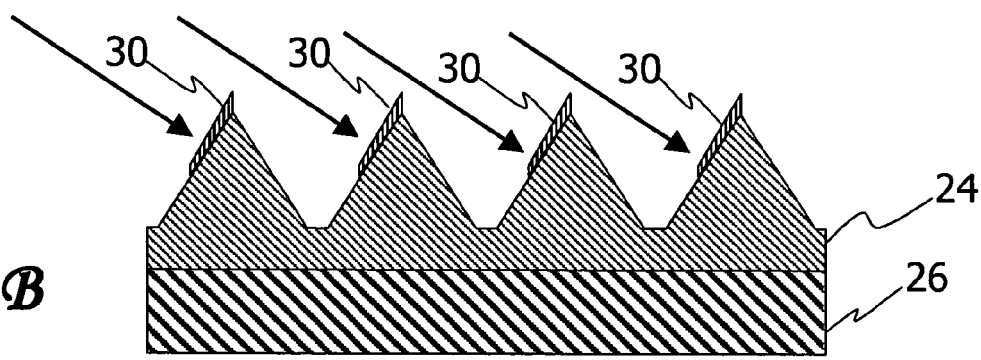
Figure 6C:
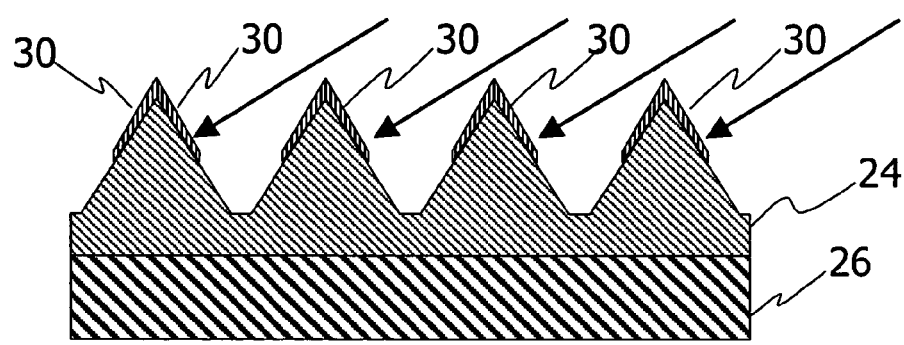
Figure 6D:
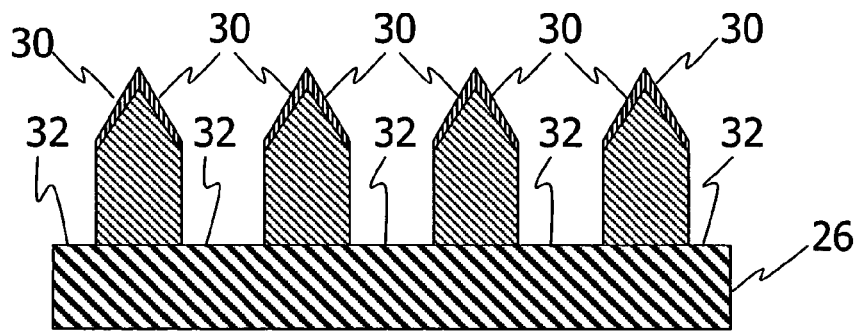

FIGS. 6A-6D show how to create a resist grating with smooth, almost vertical sidewalls starting from a triangle-profile relief pattern 28 in the patterned resist. FIG. 6A shows the resist profile after imprinting. FIG. 6B shows a layer of suitable mask material 30 (which can be metal, dielectric, or semiconductor, ceramic or a combination thereof) deposited onto one side of resist triangles 28 through an oblique angle coating process, such as shadow evaporation. FIG. 6C shows another optional deposition step consisting of oblique angle coating the tips of the resist triangles 28 from another side of the grating. FIG. 6D shows the step of removing the resist in the regions unprotected by the mask material 30 by an anisotropic etching process (reactive ion etching, chemical etching, etc.) to expose the portions 32 of the underlying substrate 26 between the mask lines 30.

After this removal step, the grating pattern can be replicated in a material that is added on substrate 26 or can be replicated directly into substrate 26 by etching.

Figure 7:
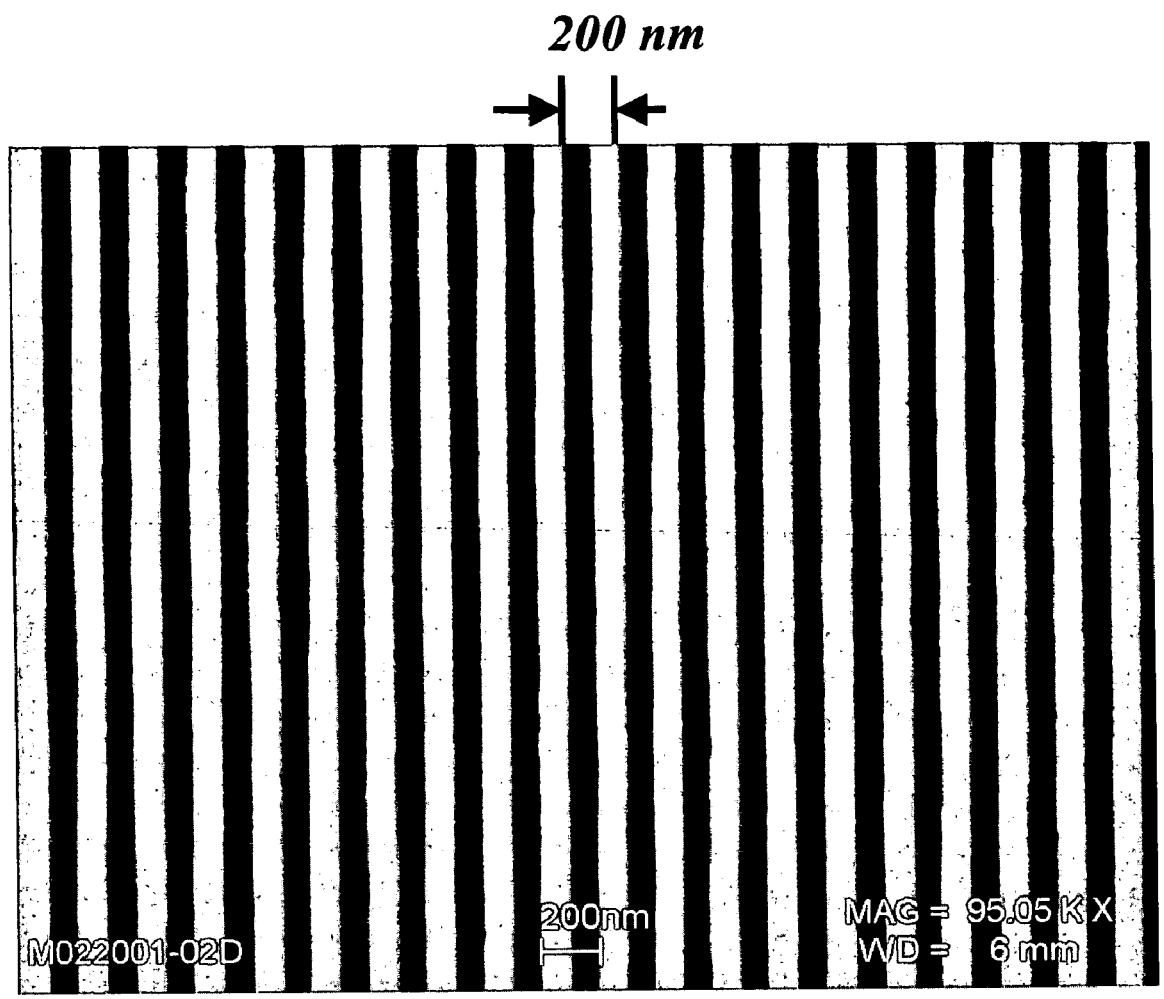
FIG. 7 is a scanning electron micrograph of the top view of a 200 nm period grating with square profile and smooth sidewalls transferred into the silicon dioxide layer on top of a silicon substrate.
Figure 8:
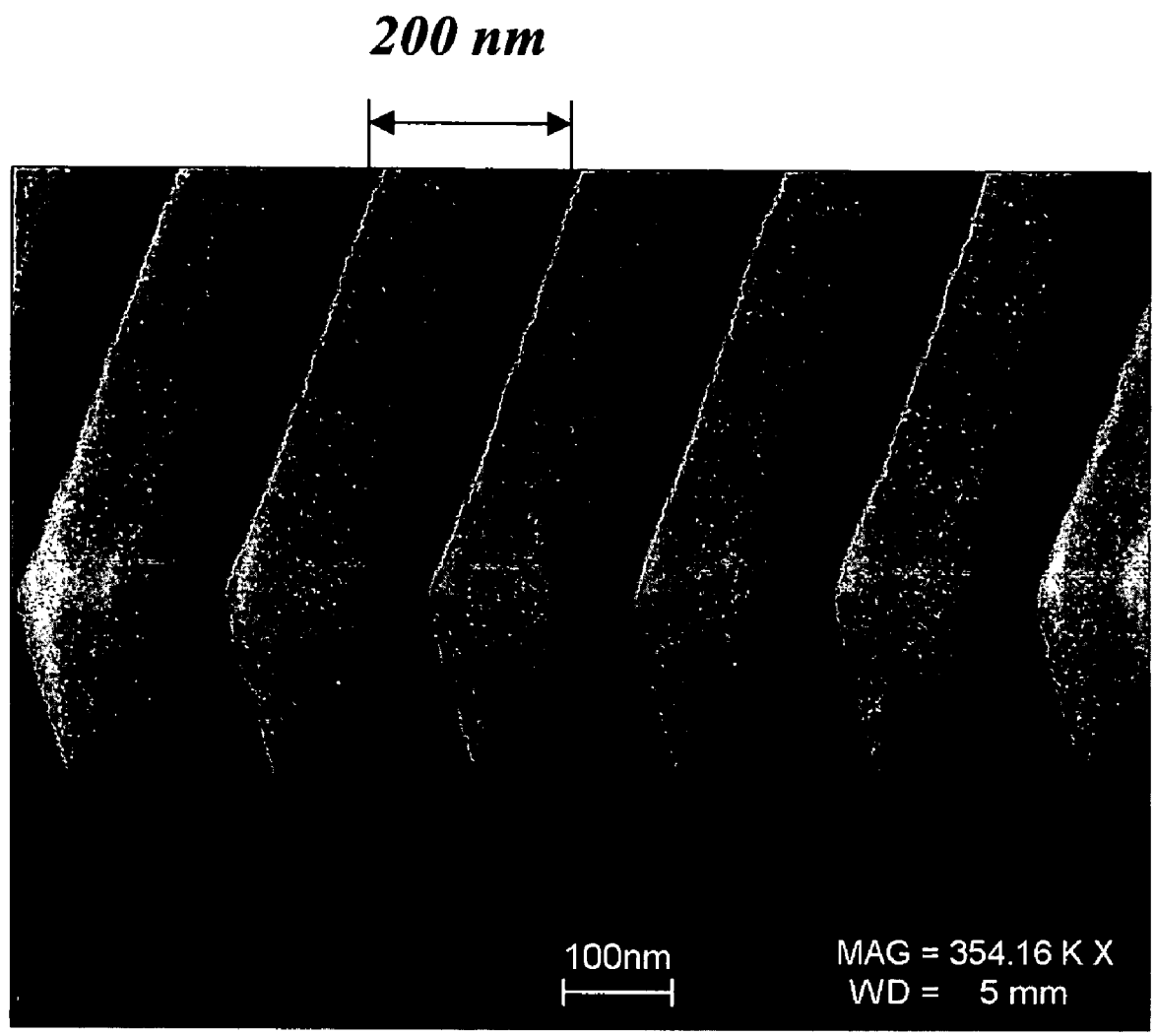
FIG. 8 is a scanning electron micrograph of a 200 nm period grating with square profile in silicon dioxide.

FIG. 7 is a scanning electron micrograph of a top view of a 200 nm period grating formed in a layer of silicon dioxide on a silicon substrate using steps depicted in FIG. 1, FIG. 4, and FIG. 6. FIG. 8 is a scanning electron micrograph of a cross-sectional view of such a grating. The sidewalls of the gratings are extremely smooth due to the wet-chemical etching mold preparation. This degree of smoothness remains an elusive and most often, unattainable goal for conventional production techniques.

Figure 9A:
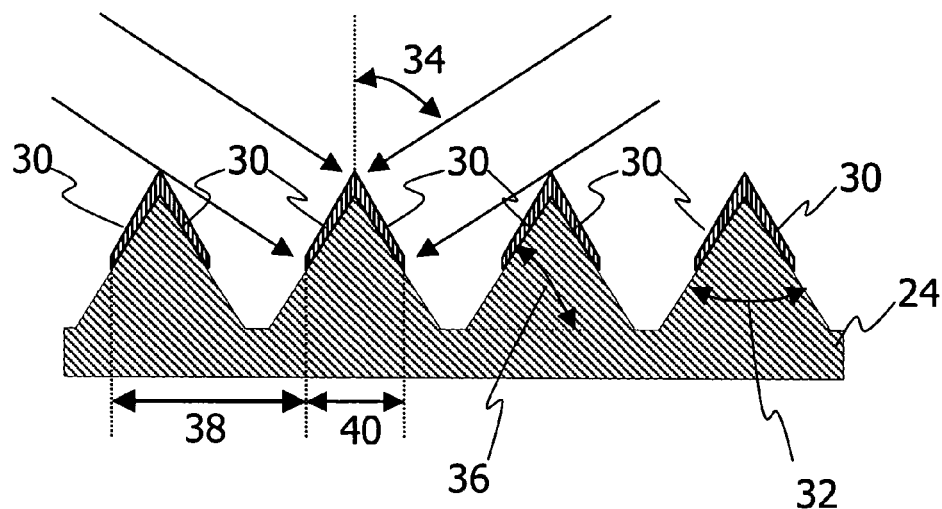
FIG. 9A is a schematic a cross-sectional view of a triangle resist grating during shadow evaporation. The line width of the evaporated mask wires is determined by the apex angle of the triangles in the resist and the angle of incidence.

In addition to the extreme smoothness of the sidewalls, the present approach provides a convenient way to control grating line-width. FIG. 9A shows an embodiment in which the mask material 30 is coated by shadow evaporation on both sides of the resist triangle 28 in two consecutive deposition steps. The line-widths in the final replicated pattern are determined by the width 40 of the portions of the resist protected by the oblique angle coated mask 30. This width can be easily changed by adjusting the angle of incidence 34 for the oblique coating step. The change depends on the geometry of the triangle profile of the grating, described by angle 32. In the case of using a wet-etched (100) silicon mold, the angles 32 and 36 in the resist are 70.52° and 54.74°, respectively. Preferably the angle 32 is in the range 25° to 75°.

Figure 9B:
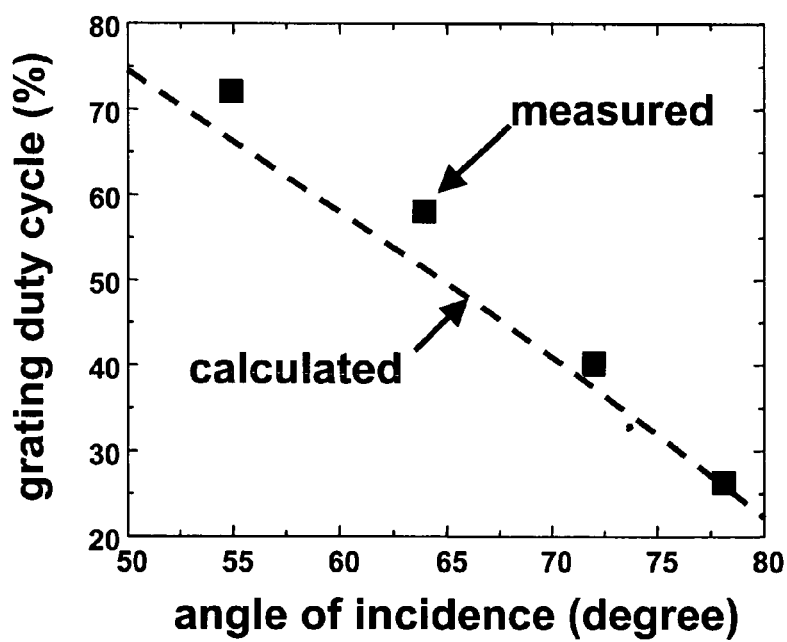
FIG. 9B graphs the calculated and measured grating duty cycle of a grating as a function of the angle of incidence for shadow evaporation, when a wet-etched triangle profile mold in (100) silicon substrate was used, and the resist was shadowed twice from opposite directions.

FIG. 9B shows calculated and experimentally measured grating duty cycles (the ratio of line-width 40 over period 38) as a function of the angle of incidence for the shadow evaporation. The data in FIG. 9B shows that the duty cycle can be easily changed over a range from 25% to 75%, which is about 400% wider than the reported range of from 50% to 60% when using interference lithography.

Also, since the duty cycle/angle of incidence dependence is almost linear, the change of duty cycle can be achieved simply by using different angles of incidence, without the need of any modification of the mold or the imprinted resist profile. Thus the duty cycle can be readily varied or controlled in a production line.

In contrast, in conventional interference lithography, the change of grating duty cycle is typically achieved by using different doses for the exposure of photo-resist, the duty cycle/dose dependence generally is not linear, the tuning range is small, the process is hard to control and not easily repeatable because line-widths are also affected by factors such as random disturbances and instability of the exposure system.

Figure 10:
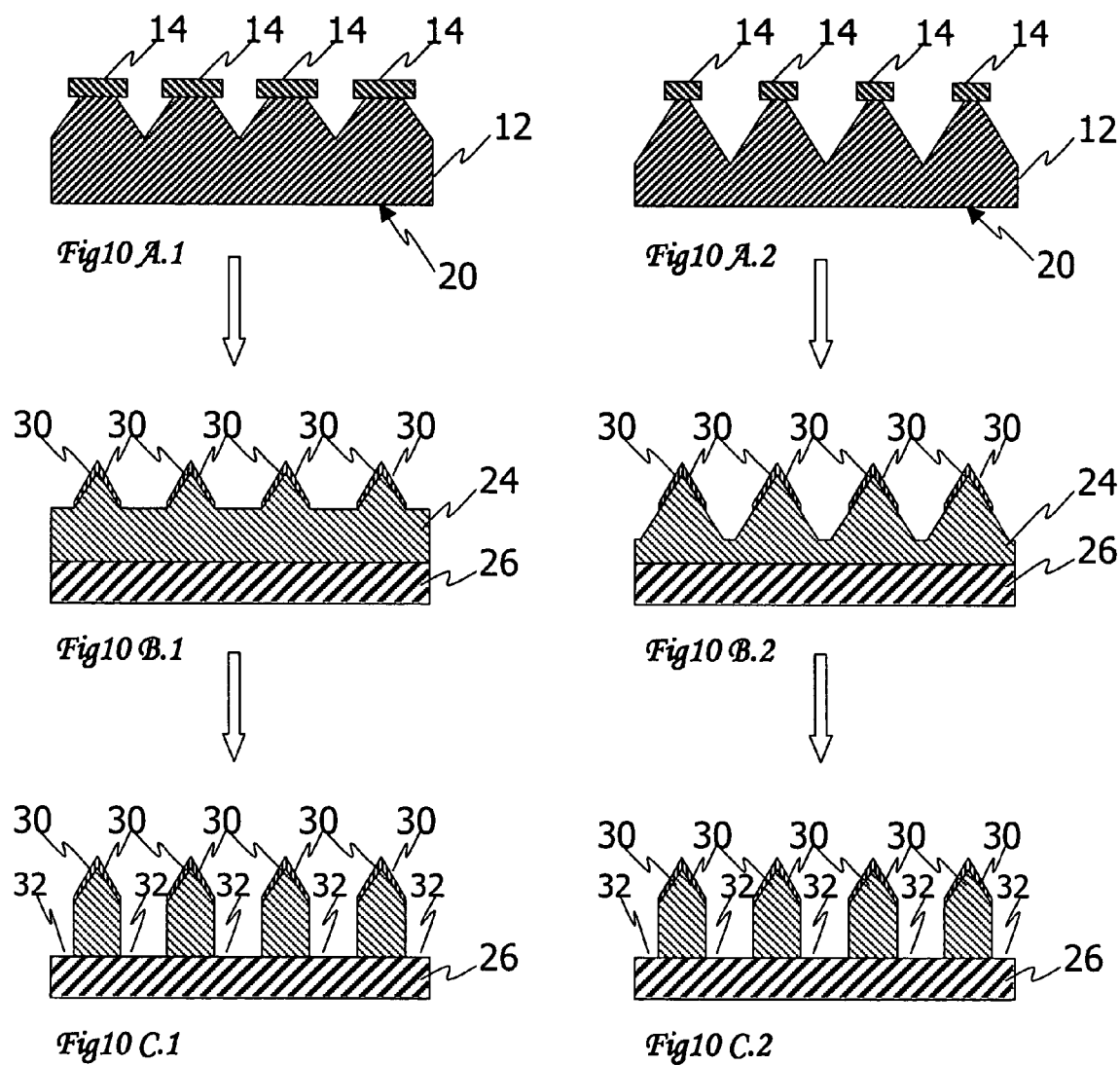

The present approach also offers the added benefit for improving grating line-width uniformity, as depicted in FIG. 10.

FIG. 10A.1 and FIG. 10A.2 show two wet-etched molds (or two different portions on the same mold) masked by gratings 14 with different line-widths. FIG. 10B.1 and FIG. 10B.2 show the resist profiles (together with the shadow-evaporation coated mask 30) imprinted using these two molds, correspondingly. Although the resist triangles have different heights, they all have the same apex angle, since the apex angle is solely determined by the orientations of the crystal planes of the mold body material. FIG. 10C.1 and FIG. 10C.2 show that after removing resist in the regions unprotected by mask 30 using an anisotropic etching process, the gratings in both cases will have the same line-width, because the line-width is affected only by the covered upper part of the resist triangles. Thus even with line-width variations from sample to sample, the present invention can improve the line-width uniformity by compensating the differences through the process depicted in FIG. 10.

Good mold release properties are important in fabricating nano-scale features by nanoimprint lithography. Using a triangle shaped grating profile instead of a square greatly facilitates mold release.

Figure 11:
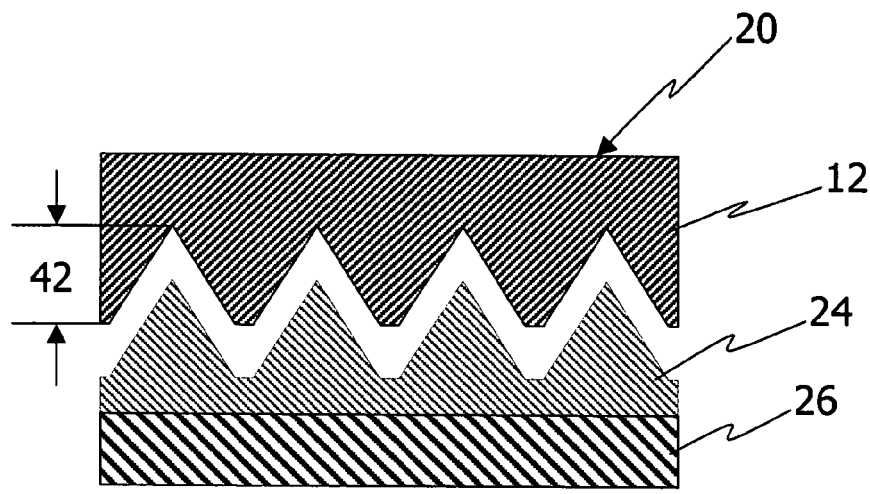
FIGS. 11A and 11B are a cross-sectional view showing mold separation for triangle and square profile molds.
Figure 11:
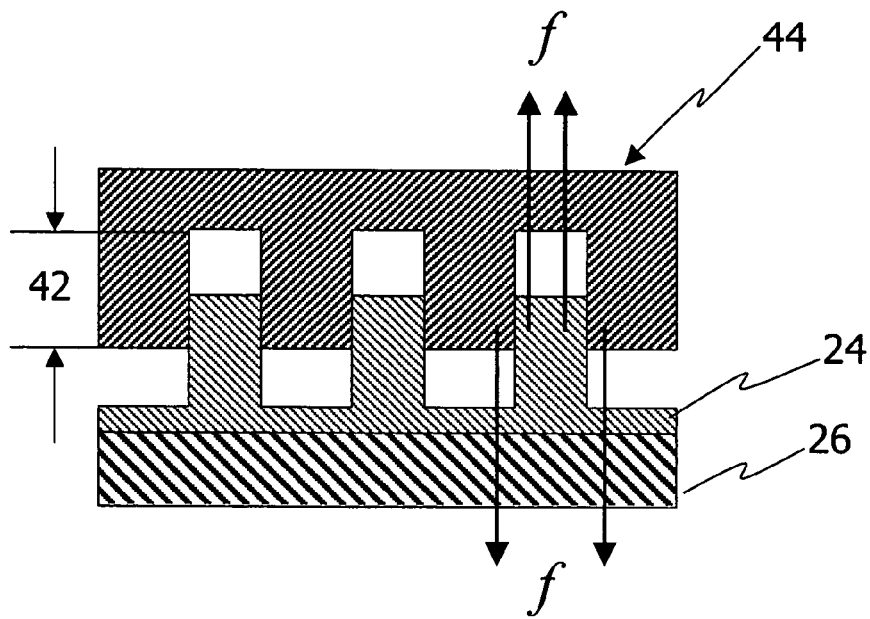

There are two contributing factors to this improvement: First, for two molds with the same grating period 38 and feature depth 42 but with different profiles (triangle and square) as shown in FIG. 11A and FIG. 11B, the contact area with the resist for a triangle profile mold 20 is only about 65% of the contact area for a square mold 44. This means a reduction in the total surface energy that needs to be overcome for mold separation. Second, the mold separation processes are different in the two cases. For a square mold 44, the sidewalls of the protruding features on the mold remain in contact with the resist until the tops of the mold features are moved out of the openings of the recesses in the patterned resist (FIG. 11B), which increases resistance to the mold release. FIG. 11A shows the removal of a triangle mold 20 from the resist 24, once the mold is raised relative to the substrate, there is no further contact between the mold features and the printed resist. The absence of "stickiness" in this case facilitates separation by reducing the resistance.

Figure 12:
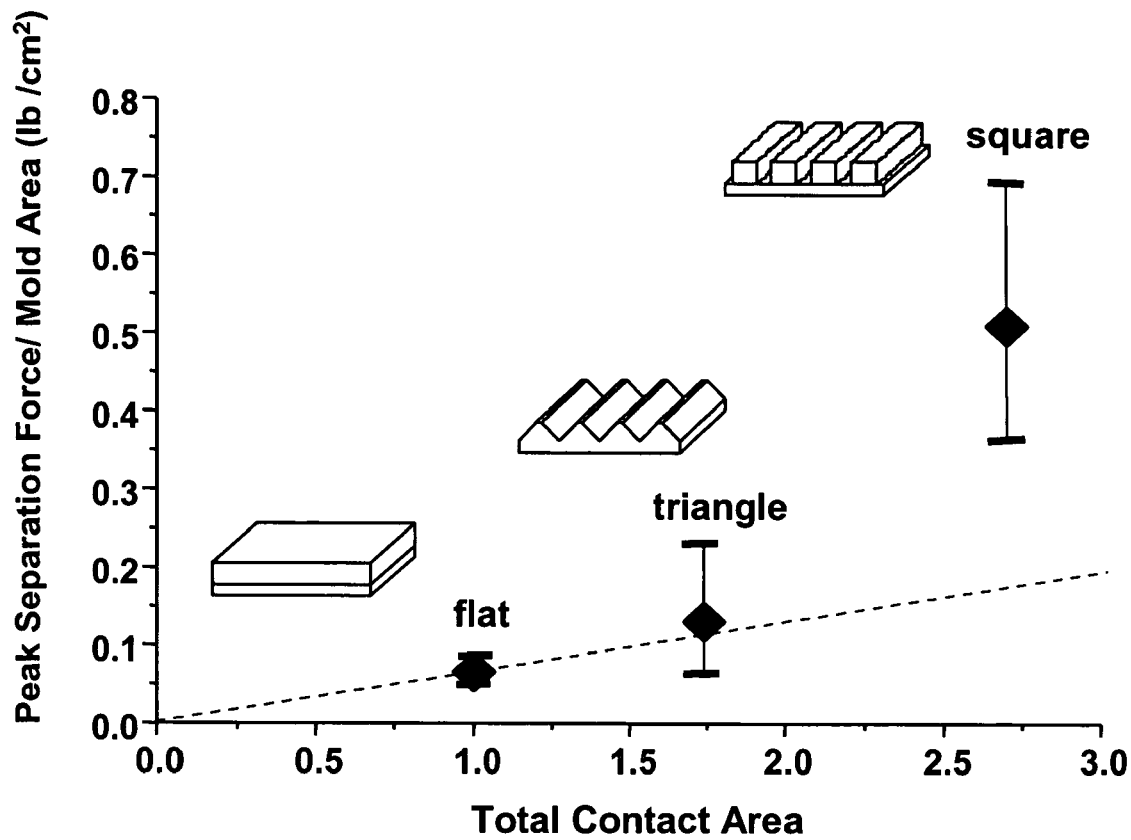
FIG. 12 compares experimentally measured peak separation forces for different mold profiles.

FIG. 12 shows the measured peak separation forces/unit mold area for molds of different profiles. The period of the gratings is 200 nm, both molds have the same feature height of 150 nm and they were treated together with the same surfactant, and the same resist (NP-60) was used in the experiment. The separation force for a flat mold (with no pattern) is also plotted for comparison.

The measurement clearly indicates that the triangle profile greatly reduced the total force needed to separate the mold from the resist, compared with a mold with square profile. Easier separation implies more flexibility in designing and choosing the imprint resists, which is very important and valuable for the implementation of large-scale production of nano-gratings by nano-imprint lithography.

III. NIL Using Smooth Walled Molds To Reduce Pattern Edge Roughness

Because line edge roughness in the master mold will also be duplicated in the resist, it is desirable to reduce sidewall roughness of the master mold. This approach to making a nanoscale surface patterned article with smooth pattern edges and sidewalls comprises the steps of 1) providing a mold with a molding surface having a plurality of protruding regions with smooth walls; 2) providing a workpiece with a moldable surface; 3) pressing the molding surface and the moldable surface together to reduce the thickness of the moldable surface under the protruding features to produce reduced thickness regions; and 4) separating the mold from the moldable surface. The workpiece can then be further processed in the patterned regions in accordance with methods well known in the art.

The wet etching technique used in the mold fabrication step illustrated in FIG. 1 provides desirable smooth side walls. However, as we will show in connection with FIG. 13, that wet etching can even improve molds having vertical rather than tapered sidewalls.

Figure 13:
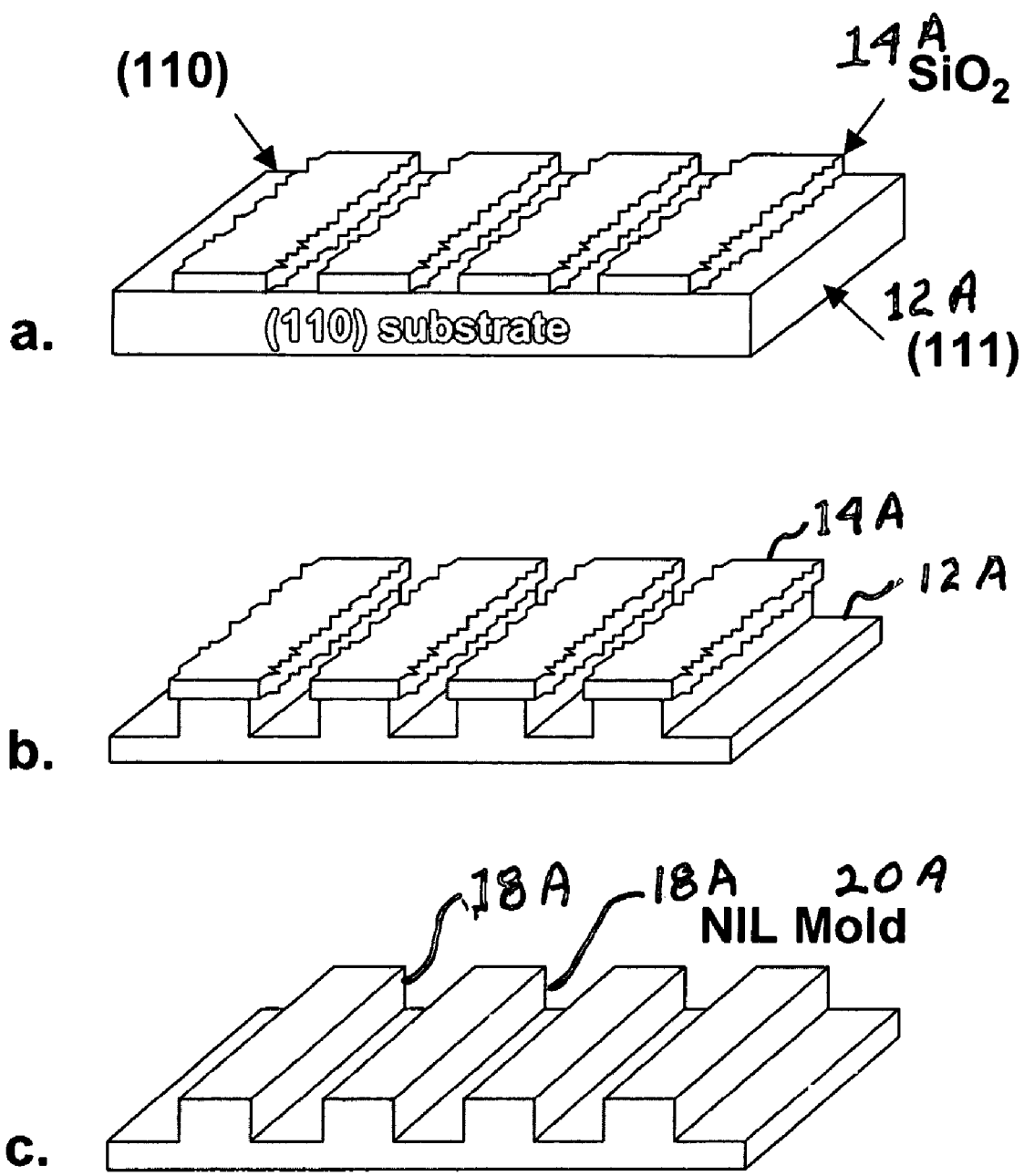
FIGS. 13A-13C illustrate fabrication of a anisotropic-etching nano-grating mold. 13A shows a substrate of (110) Si with a $SiO_2$ grating mask aligned in the <110> direction and patterned using interference lithography. 13B shows a grating pattern transferred into Si using KOH wet etch. 13C illustrates a $SiO_2$ mask removed using buffered HF etch.
Figure 14:
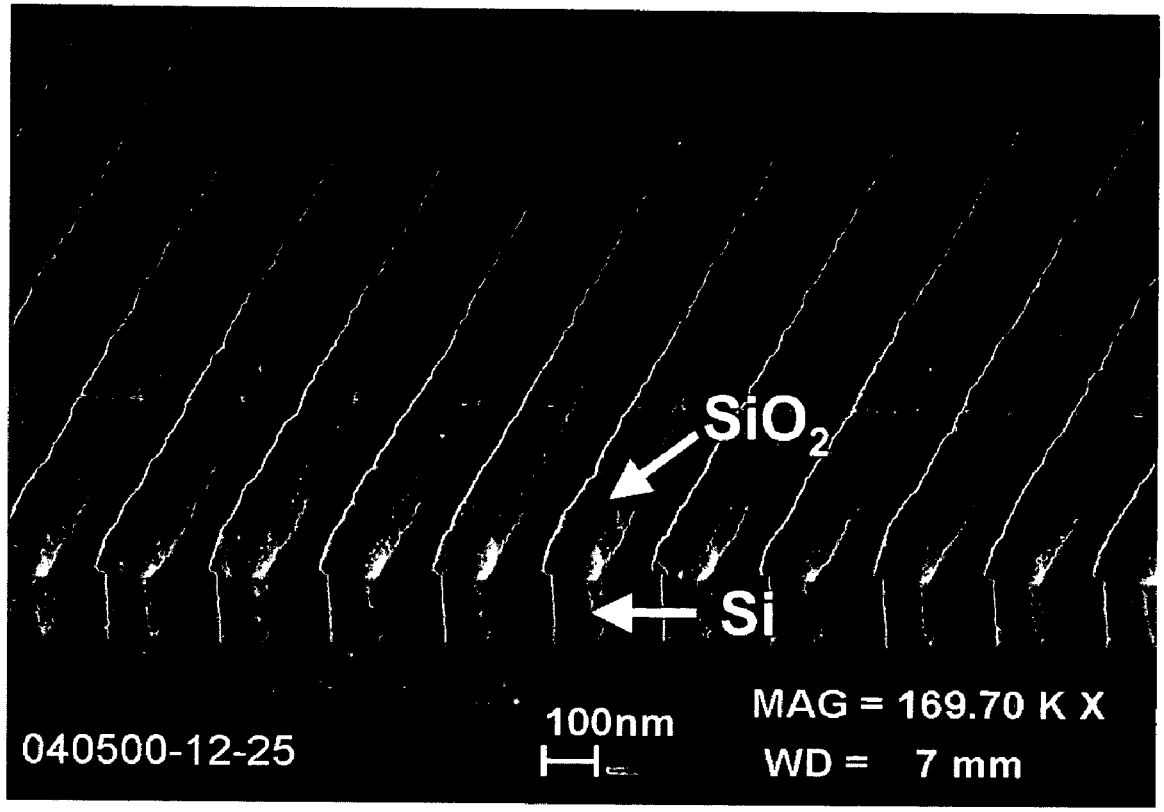
FIG. 14 shows a grating in (110) Si after the KOH wet-etch, with the $SiO_2$ mask still in place. Although the $SiO_2$ mask shows rough edges, the relief grating structure in Si has extremely smooth sidewalls.
Figure 15:
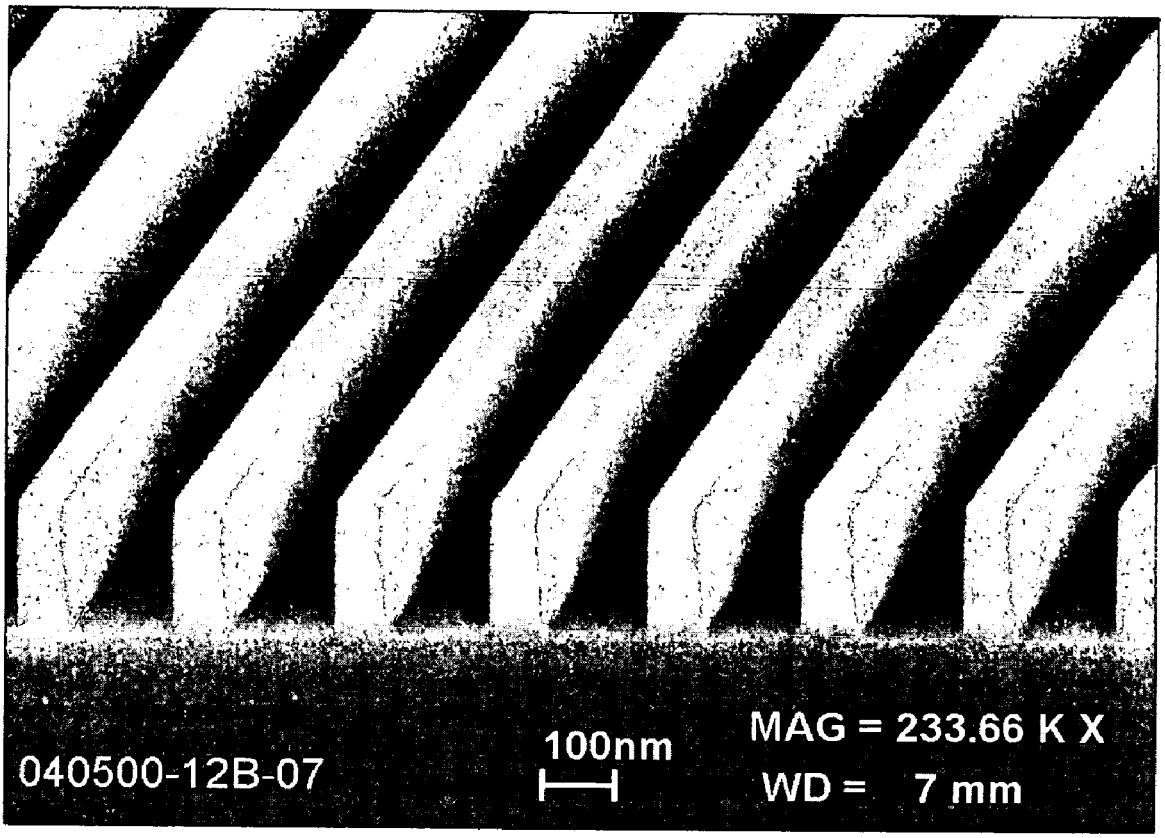
FIG. 15 is a SEM of a 200 nm period grating mold etched into (110) Si after removal of the $SiO_2$ mask. Smooth sidewalls are obtained.

FIG. 13 is a schematic of an exemplary process for the fabrication of smooth-walled grating molds. Instead of a (100) Si substrate, a (110) Si substrate 12A is used as the mold substrate. 60 nm thick oxide 10 was then thermally grown on the substrate. Gratings were carefully aligned parallel the (111) crystal plane during interference lithography and were later transferred into the oxide layer using a $CHF_3$ reactive ion etching (RIE) process to form masking elements 14A. (FIG. 13A). A KOH:deionized water:isopropyl alcohol anisotropic wet-etch was used to further transfer the grating into the underlying (110) Si substrate, with the oxide serving as an etching mask. (FIG. 13B) Because the etching rate in the (111) crystal plane direction is much slower than the etching rates in the directions of (100) and (110) plane, this process creates a Si grating mold 20A with extremely smooth substantially vertical sidewalls 18A. (FIG. 13C). FIG. 14 shows the effect of this anisotropic etching process, although the original grating in the oxide shows a high degree of edge roughness, this raggedness is not reproduced in the underlying Si grating sidewalls. Finally, as shown in FIG. 15 the oxide mask was removed using a buffered HF wet-etch.

Figure 16:
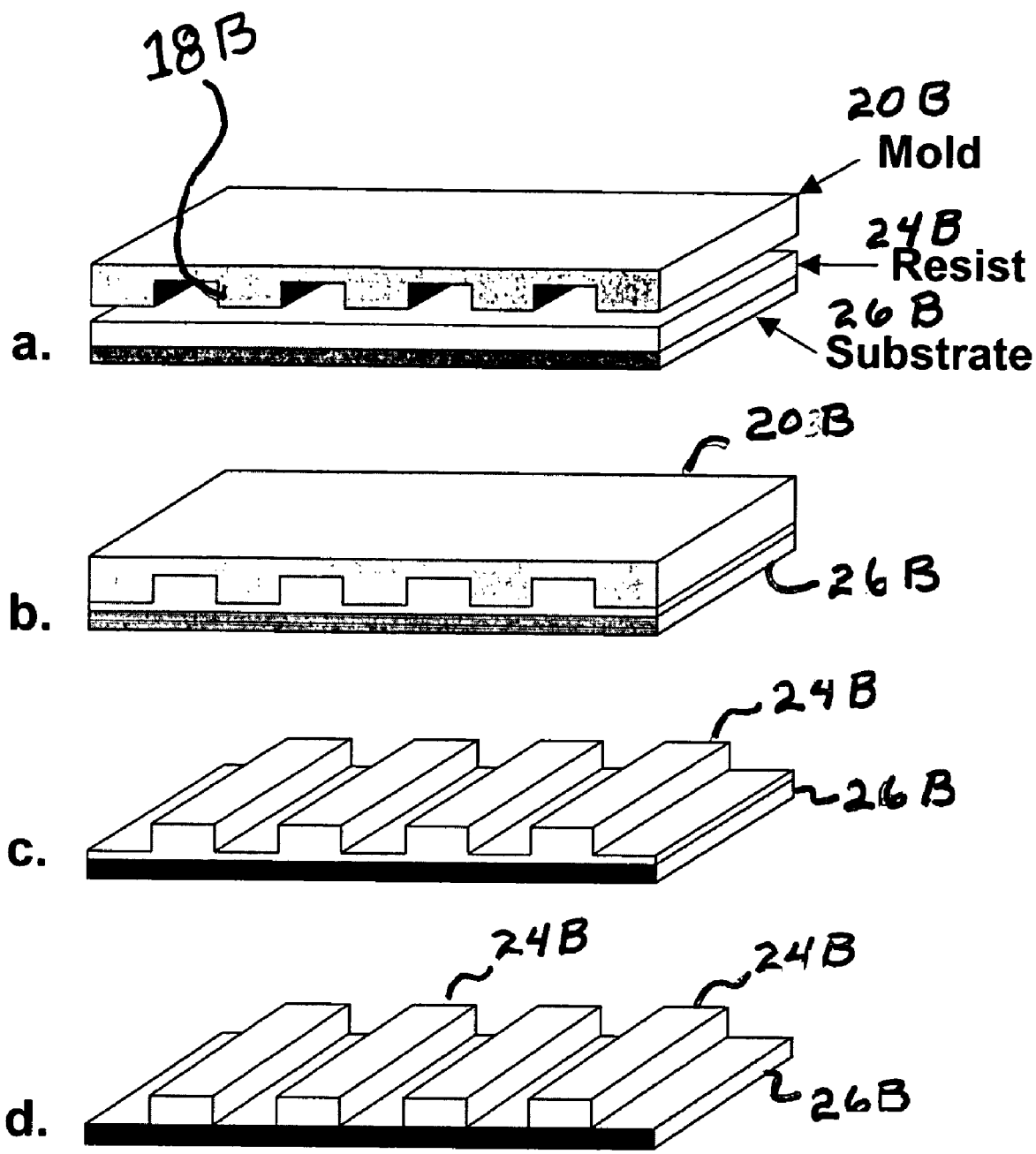
FIGS. 16A-16D are a schematically illustrates pattern duplication by NIL. In 16A the mold and substrate are pressed together. On 16B the mold and substrate are pressed together when the temperature is elevated to make the resist viscous. In 16C the mold is separated from the substrate after cooling. In 16D, an $O_2$ RIE is used to remove remaining resist in the recessed regions.

Grating patterns are duplicated onto a surface patterned article using those Si surface relief gratings as master molds by NIL, the schematic of which is shown in FIG. 16. FIG. 16A shows the provision of a mold 20B having a smooth molding surface, and a workpiece comprising a substrate 26B having a moldable surface 24B such as a resist. The molding surface has a plurality of protruding regions with extremely smooth substantially vertical sidewalls 18B as described above.

FIG. 16B illustrates pressing the molding surface and the moldable surface together to reduce the thickness of the moldable surface under the protruding features. This pressing produces reduced thickness regions.

In FIG. 16C, the mold 20B is separated from the moldable surface 24B leaving an imprinted pattern.

FIG. 16D shows the workpiece further processed, as by etching away the moldable material in the reduced thickness regions, to produce an article with a nanoscale patterned surface. Because NIL is a high resolution (sub-10 nm) lithography, line-edge smoothness of the master molds is retained during the duplication process.

Figure 17A:
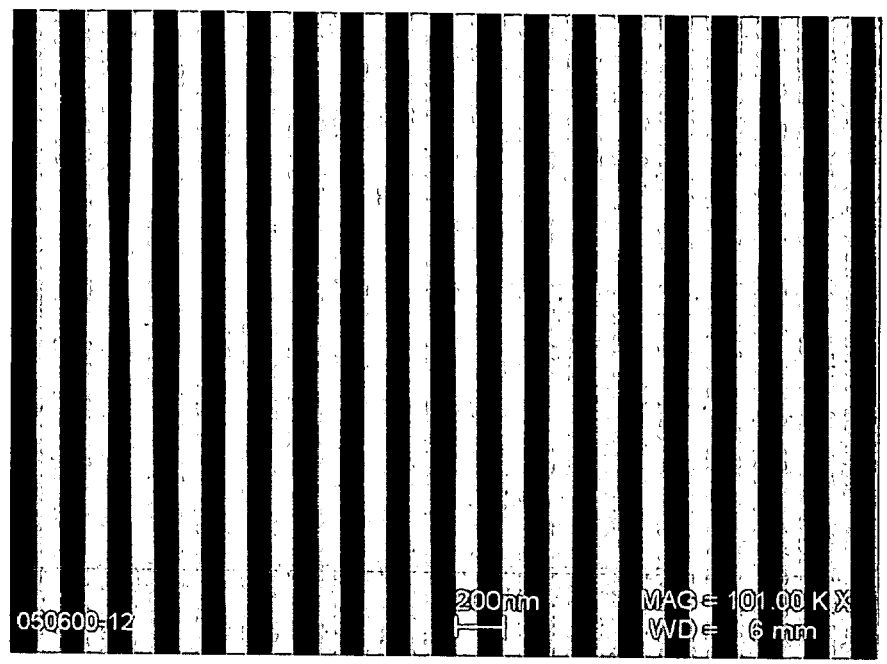
FIGS. 17A and 17B illustrate a 200 nm period resist grating patterned by NIL using a (110) Si mold.
Figure 17B:
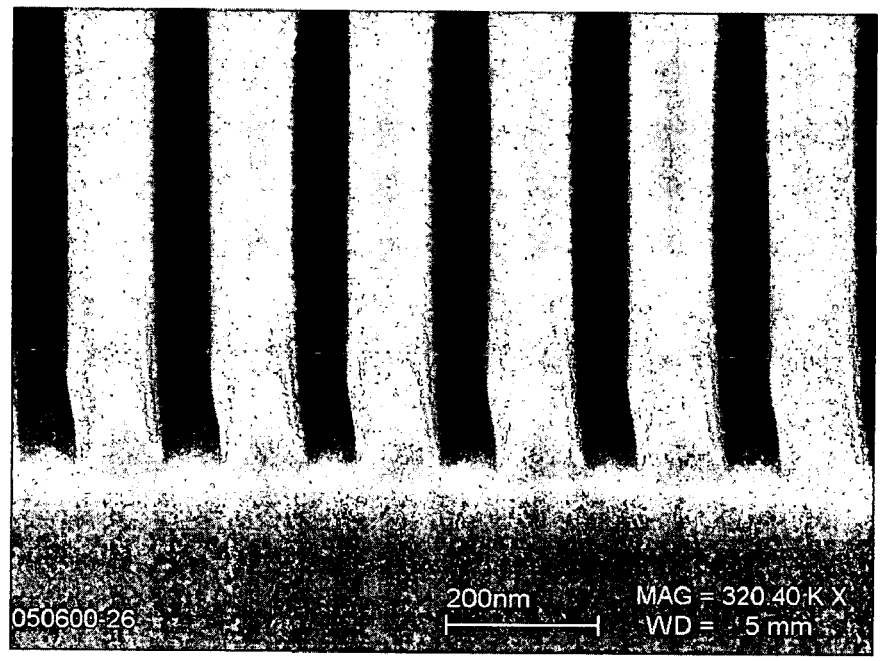

FIG. 17A shows a top-view of the grating in NIL resist after imprinting using the smooth Si mold, and FIG. 17B shows the resist profile. The resist grating has vertical and smooth sidewalls, and pattern contrast is high. These are desirable characteristics not easily achievable using conventional interference lithography.

IV. NIL Using Post-Imprinting Treatment To Reduce Roughness

A third approach uses a moldable surface that becomes viscous when heated. The approach comprises the steps of providing a workpiece with a moldable surface of such material, patterning the moldable surface into a nanoscale surface pattern and then, after the patterning, heating the moldable surface material to its viscous state. In a preferred embodiment, the method comprises the steps of 1) providing a mold with a molding surface having a plurality of protruding regions; 2) providing a workpiece with a moldable surface having a glass transition temperature; 3) pressing together the molding surface and the moldable surface to reduce the thickness of the moldable surface under the protruding features to produce reduced thickness regions; 4) separating the mold from the moldable surface; and 5) heating the moldable surface above the glass transition temperature.

This approach can be used to even further smooth moldable surfaces imprinted by the tapered mold process of FIG. 4 or the smooth side-wall molding process of FIG. 16. It can also be used to smooth surfaces imprinted by even rough sidewall conventional molds.

Figure 18:
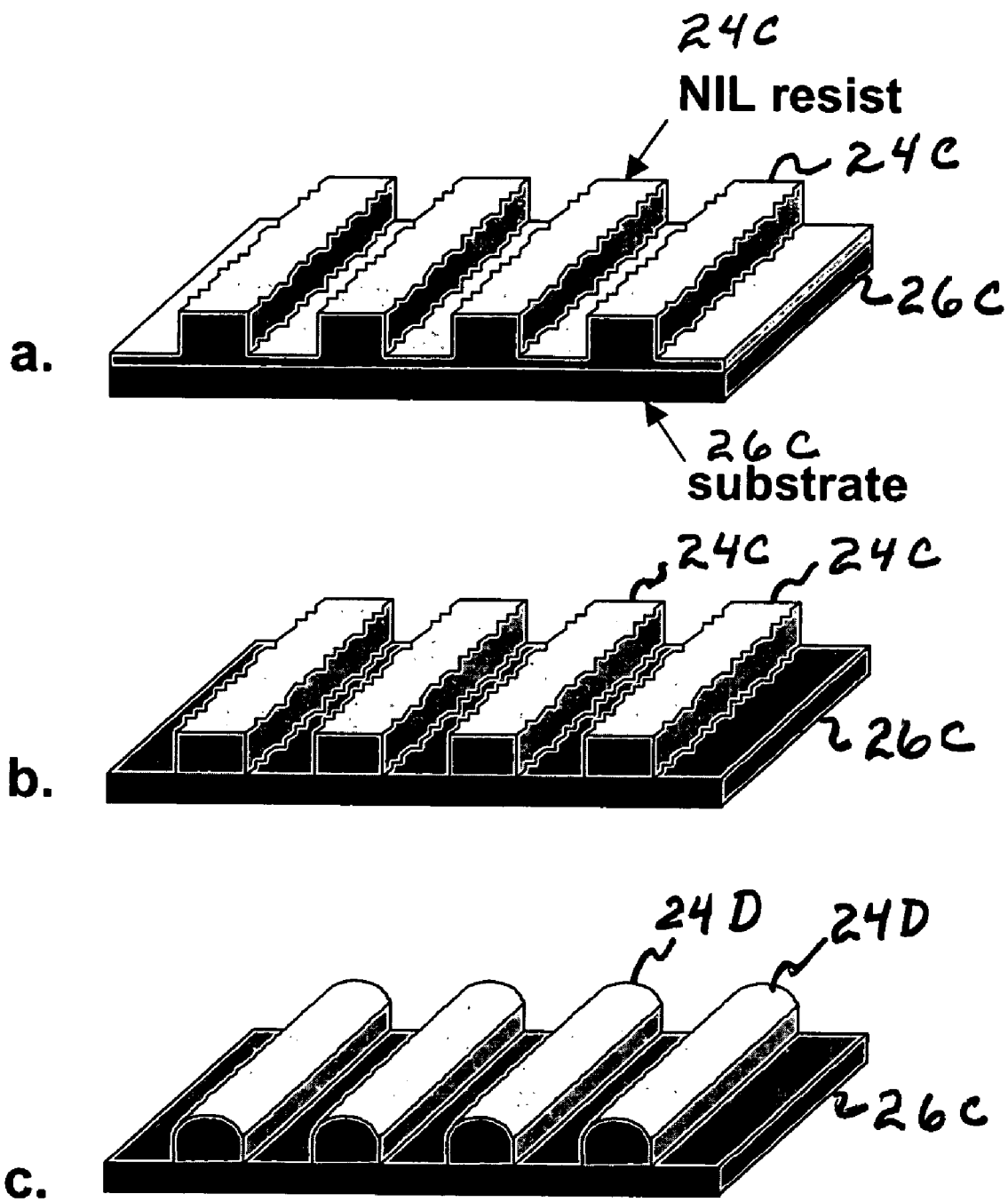
FIGS. 18A-18C reducing edge roughness by NIL and thermal annealing. 18A shows grating with rough sidewalls is patterned in the resist by NIL. 18B illustrates RIE carried out to isolate neighboring lines. 18C shows the resist becomes viscous after being heated up, resulting in a grating pattern with reduced roughness.

FIG. 18 illustrates an example of this approach to smoothing. A grating mold is patterned as by interference lithography. The mold can have rough sidewalls. The mold is then imprinted into a substrate 26C having a molding surface 24C that has a glass transition temperature. After imprinting, a grating with rough edges was reproduced in the imprint resist. (FIG. 18A) Then an $O_2$ RIE process was carried out to remove the remaining resist in the recessed region and to isolate the neighboring lines from each other (FIG. 18B). After RIE, the sample was heated so the resist becomes viscous. Because a smooth surface is energetically favorable, this thermal treatment will result in a pattern of resist elements 24D with rounded profile and significantly reduced surface roughness (FIG. 18C).

Figure 19A:
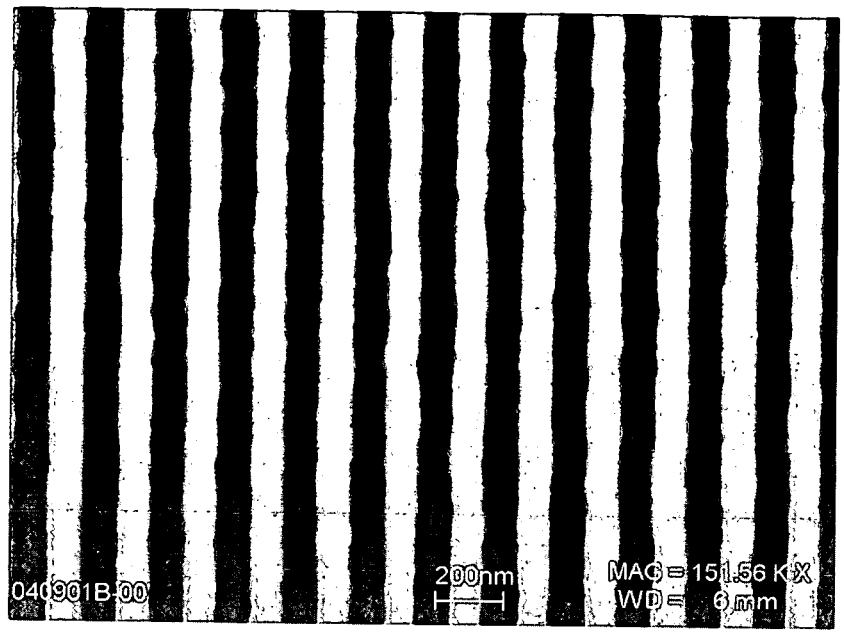
FIGS. 19A and 19B are a SEM of a 200 nm period resist grating showing the effect of thermal annealing on roughness reduction. 19A depicts a resist grating with rough edges before the thermal treatment. 19B shows the edge roughness of the resist grating is significantly reduced after a 100° C., 10 min thermal treatment.
Figure 19B:
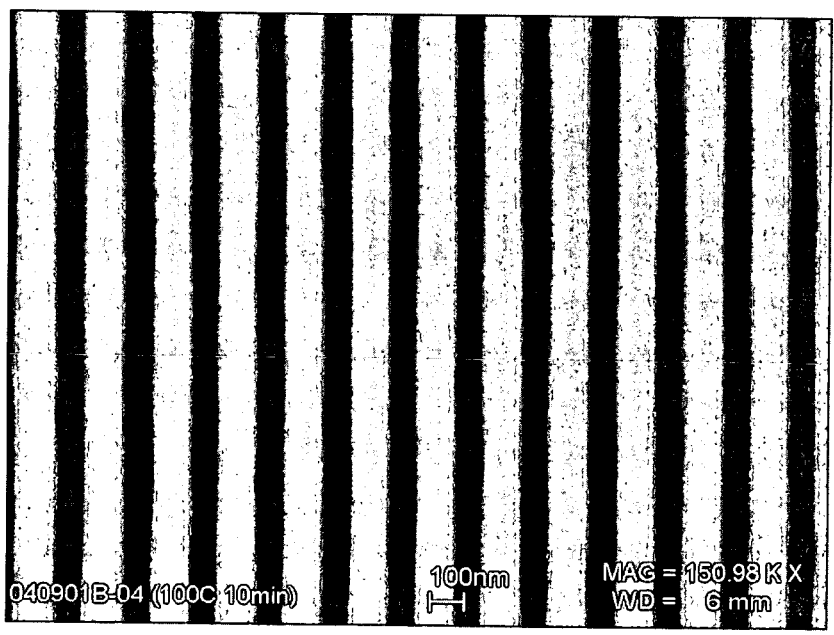

FIG. 19 shows the effect of thermal annealing on the edge roughness. In this experiment we used a polystyrene-based resist which has a flow temperature of 100° C. FIG. 19A is the top view of the resist nano-grating after imprinting using a rough-edge grating mold. The sample was then baked at 100° C. on a hot-plate for 10 minutes. FIG. 19B shows a top view of the resist pattern with smooth sidewalls after the thermal treatment.

It should be pointed out that although we used a specific imprint resist NP-60 in this experiment, this technique is not limited to this single resist. It can be applied to other thermoplastic polymers such as PMMA with similar thermal characteristics as well.

Using these NIL-based line edge roughness reduction techniques, we have successfully fabricated nano-scale gratings over large area (4-inch wafer) on various substrates. The smallest grating pitch achievable is around 190 nm, which is determined by the wavelength of the laser (351.1 nm) used in interference lithography.

These nano-scale gratings with smooth sidewalls have many important applications, including subwavelength optics, micro/nano-fluidic devices and bio-analysis for the manipulation of single biological molecules.

In subwavelength optical applications, because transmission loss increases as the second exponential of roughness' as light propagates inside the gratings, smoothing technologies can be used for the fabrication of highly-efficient subwavelength devices.

Recently we have fabricated and demonstrated a fluidic device consisting of sealed nano-channels so that double-stranded DNA molecules can be stretched and moved along these channels. Fabrication of super smooth gratings is a critical step in this application because of the small dimensions (<100 nm) of the channels, resistance encountered by the molecules as they move in the channels increases drastically as the sidewall roughness increases.

In conclusion, we have developed sidewall smoothing technologies based on nanoimprint lithography. Using these technologies, we have fabricated nano-gratings with extremely smooth sidewalls over large area. Compared with other sidewall smoothing technologies, ours are low-cost, effective and can be applied to a variety of materials and substrates. These smooth gratings have a variety of applications in optics, micro/nano-fluidic devices and biotechnology.

It should be understood that the invention is not limited to the specific techniques and materials described herein, and may be implemented in any appropriate forms. For example other types of materials can be used for the mold body. Besides SiO2, other materials (e.g. $Si3N_4$, metal, and polymer) and processes (e.g. lift-off and electron-beam lithography) can be used to pattern the initial wet-etch mask. Other etching processes and conditions can be used to etch the desired features into the mold. In some embodiments, a dry plasma etching using appropriate gases can be utilized in mold preparation to achieve a similar etching selectivity between different crystal planes, so that a comparable effect as wet chemical etching can be obtained.

It should also be pointed out that although the fabrication of one-dimensional grating structure is used here for the purpose of demonstration. The same principle can be applied to the fabrication of two-dimensional structures as well.

Figure 21:
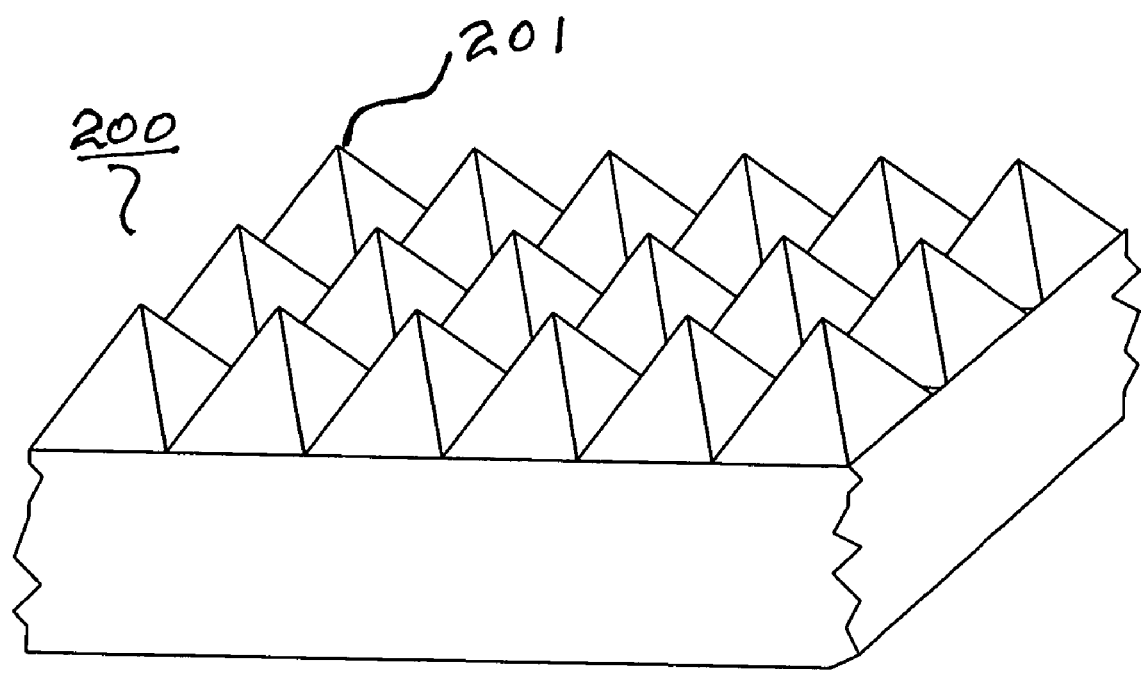
FIG. 21 illustrates a mold with pyramidal surface features.

To fabricate a two-dimensional structure, the mask 14 depicted in FIG. 1 will comprise a two-dimensional array of dots or holes. Using the steps described in FIG. 1, a mold 200 with pyramidal surface features 201 (or the reverse of the pyramids, depending on whether the original two-dimensional mask pattern is a dot array or an array of holes) can be formed as shown in FIG. 21.

Pattern transfer using the two-dimensional mold can be carried out in the same spirit as the steps described in FIG. 4 and FIG. 5. The fabricated features can be arrays of dots or holes, depending on the mold and the particular pattern transfer process used. However, the same principle of feature dimension control by using different incident angle 34 as depicted in FIG. 9A also applies in this case.

It can now be seen that one aspect of the invention is a nanoscale patterned article having on at least one surface a pattern comprising a plurality of protruding features and recessed features, at least one protruding feature having smooth edges, smooth sidewalls and a minimum lateral dimension between the sidewalls, the edges and sidewalls having a maximum surface roughness less than 5 nanometers and the minimum lateral dimension less than 100 nanometers. Typically a plurality of the protruding features protrude from the surface by a distance in the range 5 to 250 nanometers. In a typical embodiment, a plurality of protruding features comprise an array of parallel lines separated by recessed features to form a grating.

Another aspect of the invention is a method of making an article comprising a nanoscale surface pattern having reduced edge and/or sidewall roughness. The method comprises the steps of: 1) providing a mold with a molding surface having one or more nanoscale protruding regions tapering toward the end distal the surface, the protruding regions arranged complementary to the pattern; 2) providing a workpiece with a moldable surface; 3) pressing together the molding surface and the moldable surface to reduce thickness of the moldable surface under the protruding features; and 4) separating the mold from the moldable surface.

A third aspect of the invention involves the use of very smooth mold sidewalls. Specifically, a method of making an article comprising a nanoscale surface pattern having reduced edge and/or sidewall roughness comprising the steps of: 1) providing a mold with a molding surface having one or more nanoscale protruding regions having smooth sidewalls with a surface roughness of less than about 5 nanometers, the protruding regions arranged complementary to the pattern; 2) providing a workpiece with a moldable surface and the moldable surface; 3) pressing together the molding surface and the moldable surface to reduce the thickness of the moldable surface under the protruding features; and 4) separating the mold from the moldable surface.

Yet another aspect of the invention involves the use of a moldable surface that becomes viscous upon heating. In a preferred embodiment, it is a method of making an article comprising a nanoscale surface pattern having reduced edge and/or sidewall roughness comprising the steps of: 1) providing a mold with a molding surface having one or more protruding regions arranged complementary to the pattern; 2) providing a workpiece with a moldable surface of material having a glass transition temperature; 3) pressing together the molding surface and the moldable surface to reduce the thickness of the moldable surface under the protruding features, thereby imprinting the pattern on the moldable surface; 4) separating the mold from the moldable surface; and 5) heating the moldable surface above the glass transition temperature to smooth the edges and sidewalls of the imprinted pattern.

Although the present invention has been described with reference to preferred embodiments, workers skilled in the art will recognize that changes may be made in form and detail without departing from the spirit and scope of the invention.

What is claimed is:

1. A method of making an article comprising a nanoscale surface pattern having reduced edge and/or sidewall roughness comprising the steps of:

providing a mold with a molding surface having one or more nanoscale protruding regions tapering toward the end distal the surface, the protruding regions arranged complementary to the pattern, at least one of the protruding features having a minimum lateral dimension less than 200 nanometers and smooth edges and sidewalls having a minimum surface roughness of less than 5 nanometers;

providing a workpiece comprising a substrate and a moldable surface layer;

pressing together the molding surface and the moldable surface to reduce the thickness of the moldable surface layer under the protruding features; and separating the mold from the moldable surface;

wherein providing the mold comprises providing a mold substrate having a nanoscale pattern of etch resistant masking material;

anisotropically etching portions of the masked mold substrate to etch recessed regions with converging walls, thereby leaving tapered protruding regions under the masking material;

removing the masking material;

depositing a second etch resistant material on portions of the tapered protruding regions by to form masked protruding regions; and etching the masked protruding regions to produce substantially vertical sidewalls on the unmasked portions of the protruding regions.

2. The method of claim 1 wherein the article is a grating and protruding regions comprise an array of parallel lines.

3. The method of claim 1 wherein the pattern comprises a linear array of parallel protruding lines and the angle of the oblique coating is adjusted to control the spacing between successive lines.

4. The method of claim 1 wherein the mold substrate comprises crystalline material and the surface is parallel to one of the (100) crystalline planes.

5. The method of claim 4 wherein the crystalline material is silicon and the silicon is etched with an anisotropic wet etchant having an etching rate normal to the (100) plane that is higher than the rate normal to the (111) plane.

* * * * *